(12) United States Patent
Kim et al.

(10) Patent No.: US 11,239,311 B2
(45) Date of Patent: Feb. 1, 2022

(54) SEMICONDUCTOR DEVICE AND METHOD OF MANUFACTURING THE SEMICONDUCTOR DEVICE

(71) Applicant: SAMSUNG ELECTRONICS CO., LTD., Suwon-si (KR)

(72) Inventors: Hui-Jung Kim, Seongnam-si (KR); Kyu Jin Kim, Seoul (KR); Sang-Il Han, Seoul (KR); Kyu Hyun Lee, Hwaseong-si (KR); Woo Young Choi, Seoul (KR); Yoo Sang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/897,492

(22) Filed: Jun. 10, 2020

(65) Prior Publication Data
US 2021/0126090 A1 Apr. 29, 2021

(30) Foreign Application Priority Data
Oct. 24, 2019 (KR) .......................... 10-2019-0132658

(51) Int. Cl.
*H01L 29/06* (2006.01)
*H01L 29/423* (2006.01)

(52) U.S. Cl.
CPC ...... *H01L 29/0649* (2013.01); *H01L 29/4236* (2013.01); *H01L 29/4238* (2013.01); *H01L 29/42368* (2013.01)

(58) Field of Classification Search
CPC ... H01L 29/06; H01L 29/064; H01L 29/0649; H01L 29/42; H01L 29/423; H01L 29/4236; H01L 29/42368; H01L 29/4238

USPC .......................................................... 257/288
See application file for complete search history.

(56) References Cited

U.S. PATENT DOCUMENTS

| 9,362,422 B2 | 6/2016 | Lim |
| 9,741,854 B2 | 8/2017 | Bai et al. |
| 10,186,511 B2 | 1/2019 | Lin et al. |

(Continued)

FOREIGN PATENT DOCUMENTS

| KR | 10-0546109 B1 | 1/2006 |
| KR | 10-2007-0073053 A | 7/2007 |
| KR | 10-2008-0069428 A | 7/2008 |

(Continued)

*Primary Examiner* — Monica D Harrison
(74) *Attorney, Agent, or Firm* — Lee IP Law, P.C.

(57) ABSTRACT

A semiconductor device including a device isolation layer defining an active region; a first trench in the device isolation layer; a second trench in the active region; a main gate electrode structure filling a portion of the first trench and including a first barrier conductive layer and a main gate electrode; a pass gate electrode structure filling a portion of the second trench and including a second barrier conductive layer and a pass gate electrode; a support structure filling another portion of the second trench above the pass gate electrode; a first capping pattern filling another portion of the first trench above the main gate electrode; and a second gate insulating layer extending along a bottom and sidewall of the second trench, wherein the second barrier conductive layer is between the second gate insulating layer and the pass gate electrode and extends along a bottom and sidewall thereof.

19 Claims, 33 Drawing Sheets

(56) References Cited

U.S. PATENT DOCUMENTS

2019/0051652 A1* 2/2019 Kim .................. H01L 29/4966

FOREIGN PATENT DOCUMENTS

| KR | 10-2008-0088105 A | 10/2008 |
| KR | 10-0905173 B1 | 6/2009 |

* cited by examiner

SEMICONDUCTOR DEVICE AND METHOD OF MANUFACTURING THE SEMICONDUCTOR DEVICE

CROSS-REFERENCE TO RELATED APPLICATION

Korean Patent Application No. 10-2019-0132658, filed on Oct. 24, 2019, in the Korean Intellectual Property Office, and entitled: "Semiconductor Device and Method of Manufacturing the Semiconductor Device," is incorporated by reference herein in its entirety.

BACKGROUND

1. Field

Embodiments relate to a semiconductor device and a method of manufacturing the semiconductor device.

2. Description of the Related Art

As a semiconductor memory device becomes more highly integrated, individual circuit patterns have become more miniaturized to realize more semiconductor devices within the same area. A buried channel array transistor (BCAT) may include a gate electrode embedded in a trench to minimize a short channel effect.

SUMMARY

The embodiments may be realized by providing a semiconductor device including a device isolation layer defining an active region in a substrate; a first trench in the device isolation layer; a second trench in the active region; a main gate electrode structure filling a lower portion of the first trench, the main gate electrode structure including a first barrier conductive layer and a main gate electrode; a pass gate electrode structure filling a lower portion of the second trench, the pass gate electrode structure including a second barrier conductive layer and a pass gate electrode; a support structure filling an upper portion of the second trench above the pass gate electrode; a first capping pattern filling an upper portion of the first trench above the main gate electrode; and a second gate insulating layer extending along a bottom surface and a sidewall of the second trench, wherein the second barrier conductive layer is between the second gate insulating layer and the pass gate electrode and extends along a bottom surface and a sidewall of the pass gate electrode.

The embodiments may be realized by providing a semiconductor device including an active region extending in a first direction in a substrate; a device isolation layer defining the active region in the substrate; a second gate trench in the device isolation layer, the second gate trench extending in a second direction forming a first acute angle with respect to the first direction; a pass gate electrode filling a lower portion of the second gate trench in the device isolation layer; a support structure filling an upper portion of the second gate trench above the pass gate electrode; and a second barrier conductive layer extending along a surface between a top surface of the pass gate electrode and a bottom surface of the support structure.

The embodiments may be realized by providing a semiconductor device including a device isolation layer defining an active region in a substrate; a first trench in the active region; a second trench in the device isolation layer; a main gate electrode structure filling a lower portion of the first trench, the main gate electrode structure including a first barrier conductive layer and a first filling conductive layer; a pass gate electrode structure filling a lower portion of the second trench, the pass gate electrode structure including a second barrier conductive layer and a second filling conductive layer; a support structure filling an upper portion of the second trench above the pass gate electrode structure; and a first capping pattern filling an upper portion of the first trench above the main gate electrode structure, wherein the second barrier conductive layer extends along a surface between the bottom surface of the support structure and a top surface of the second filling conductive layer, a height of the support structure is greater than a height of the first capping pattern, with respect to a top surface of the substrate, and a maximum width of the first capping pattern and a maximum width of the support structure are different from each other.

BRIEF DESCRIPTION OF THE DRAWINGS

Features will be apparent to those of skill in the art by describing in detail exemplary embodiments with reference to the attached drawings in which.

DETAILED DESCRIPTION OF THE EMBODIMENTS

Hereinafter, a semiconductor device according to some embodiments will be described with reference to FIGS. 1 to 7. As an example of a semiconductor device according to some embodiments, a dynamic random access memory (DRAM) is illustrated.

Figure 1:
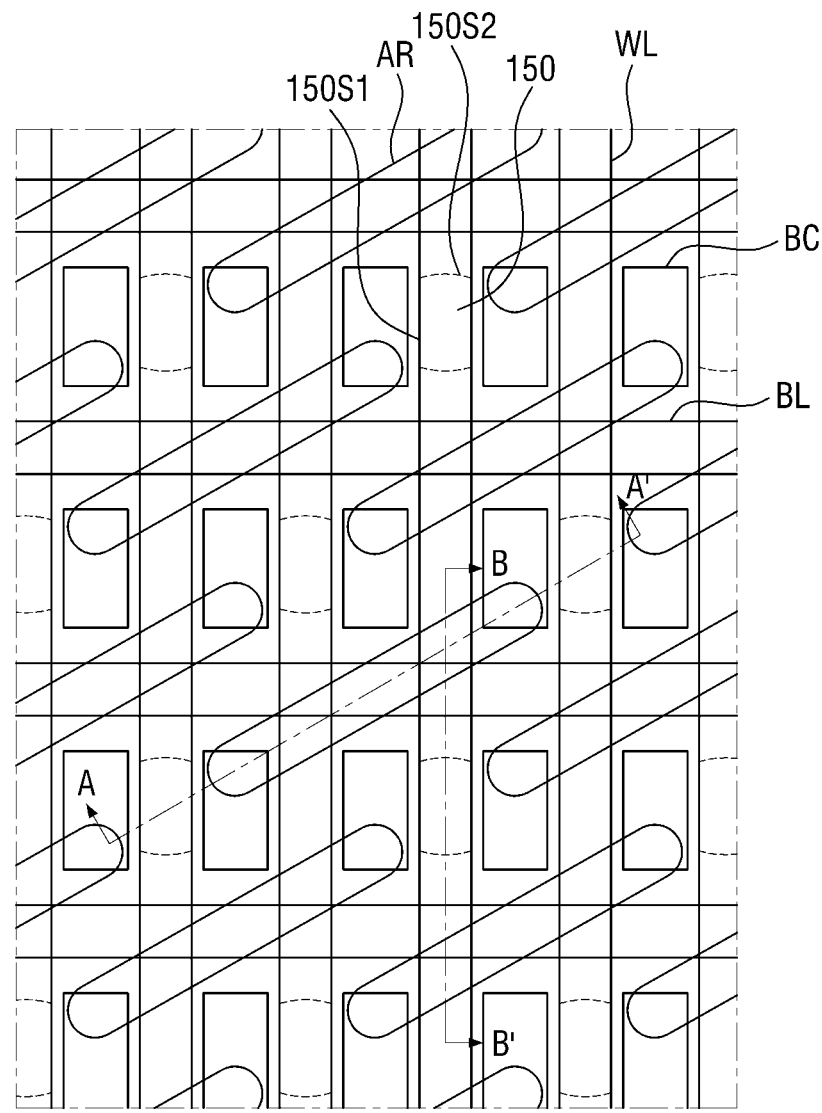
FIG. 1 illustrates a schematic diagram of a semiconductor device according to some embodiments.
Figure 2:
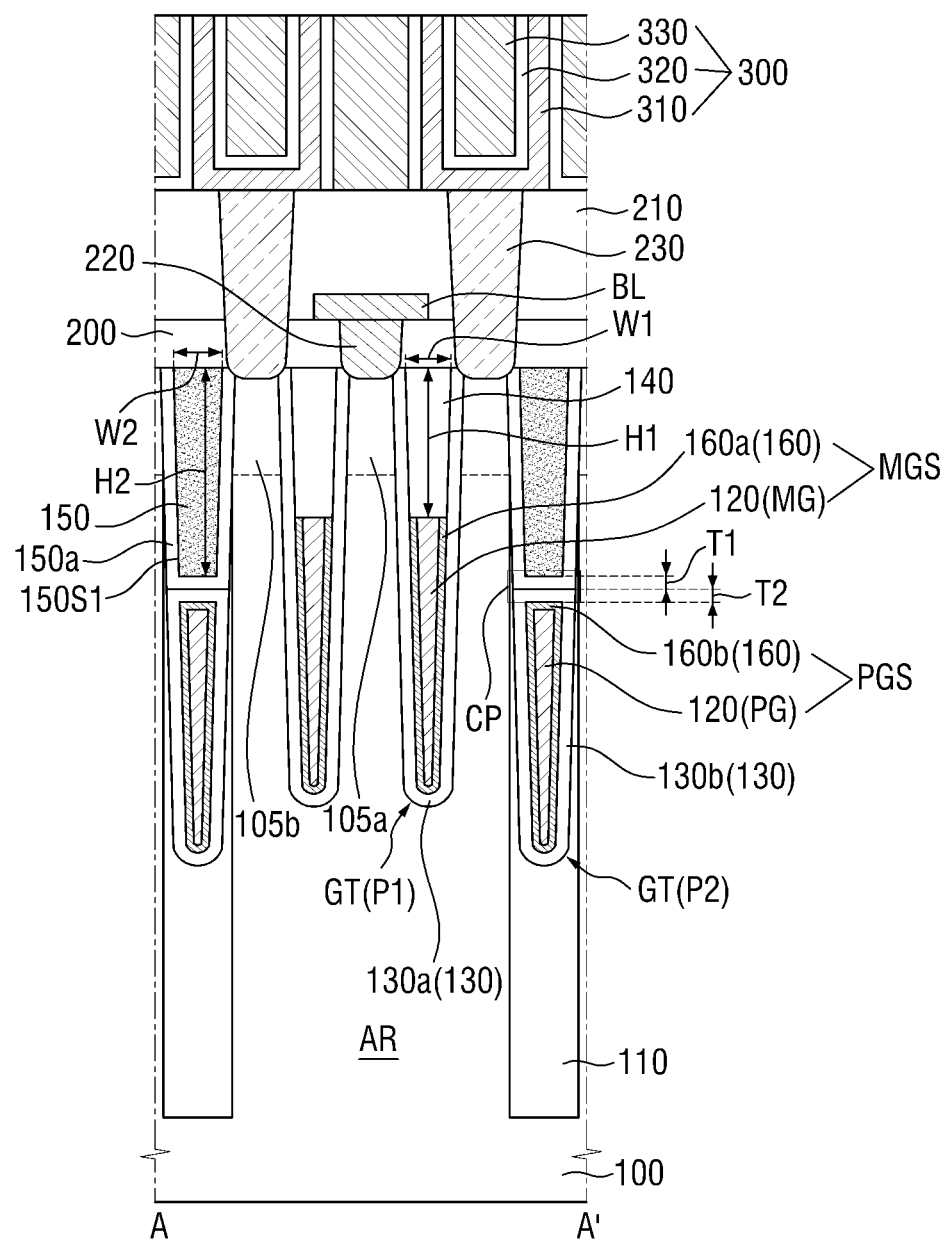
FIG. 2 illustrates a cross-sectional view taken along line A-A' of FIG. 1.
Figure 3:
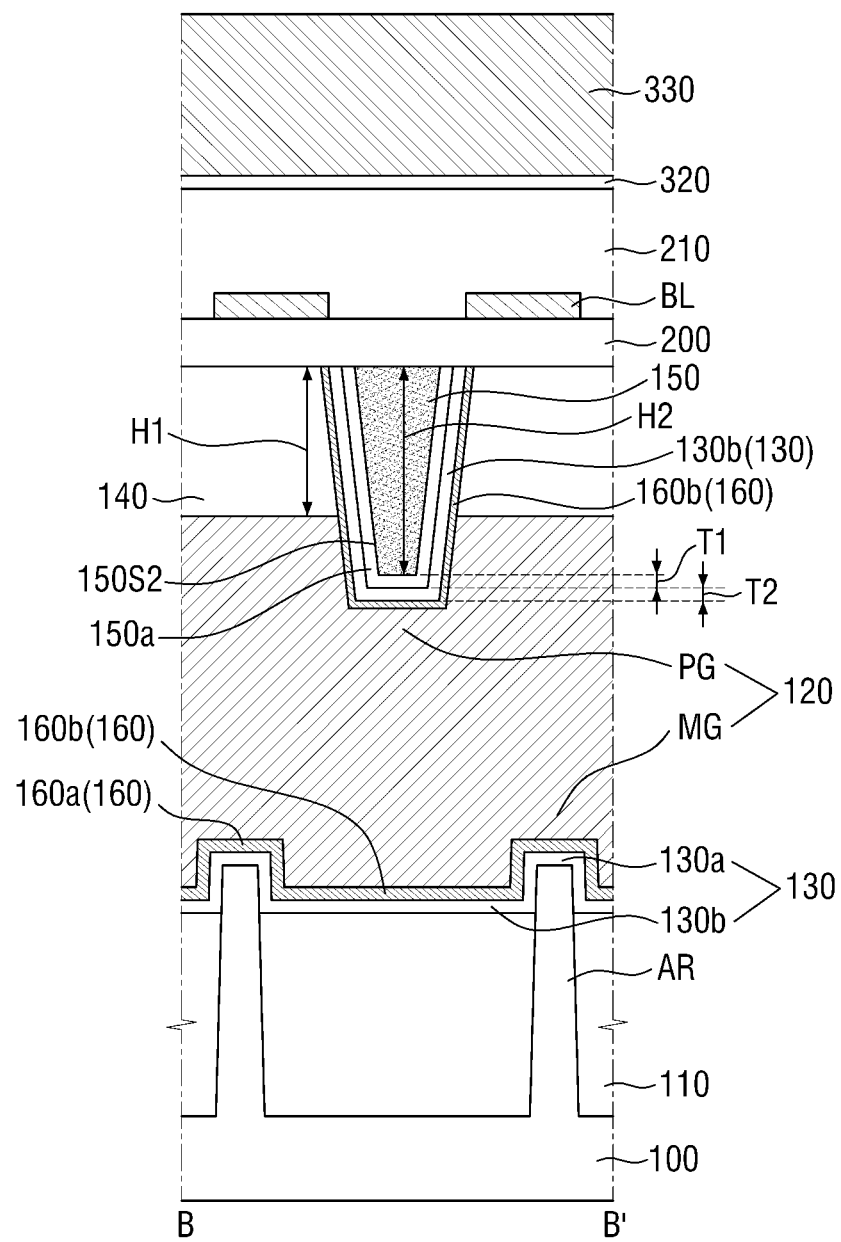
FIG. 3 illustrates a cross-sectional view taken along line B-B' of FIG. 1.

FIG. 1 illustrates a schematic diagram of a semiconductor device according to some embodiments. FIG. 2 illustrates a cross-sectional view taken along line A-A' of FIG. 1. FIG. 3 illustrates a cross-sectional view taken along line B-B' of FIG. 1.

Referring to FIGS. 1 to 3, a semiconductor device according to some embodiments may include a substrate 100, a device isolation layer 110, a word line WL (gate electrode 120), a bit line BL, a gate trench GT, a gate insulating layer 130, a capping pattern 140, a support structure 150, a first interlayer insulating layer 200, a second interlayer insulating layer 210, a first contact structure 220, a second contact structure 230, and a capacitor structure 300.

In an implementation, the substrate 100 may have a structure in which a base substrate and an epitaxial layer are stacked. The substrate 100 may be a silicon substrate, a gallium arsenide substrate, a silicon germanium substrate, or a silicon-on-insulator (SOI) substrate. For example, hereinafter, the substrate 100 is described as a silicon substrate. Hereinafter, for simplicity of description, the substrate 100 is described as having a first conductivity type (e.g., p-type). As used herein, the term "or" is not an exclusive term, e.g., "A or B" would include A, B, or A and B.

The substrate 100 may include an active region AR. The active region AR may extend in a first direction DR1 in the substrate 100. For example, a plurality of unit active regions AR may extend in the first direction DR1 in the substrate 100.

The active region AR may be in the form of a plurality of bars extending in directions parallel to each other. In an implementation, a center of one of the plurality of active regions AR may be adjacent to an end of another active region AR.

The word line WL may extend long along a second direction DR2 across the active regions AR. A plurality of word lines WL may extend in parallel to each other. The plurality of word lines WL may be spaced apart from each other at equal intervals.

The bit line BL may extend in a third direction DR3 to cross the word line WL. A plurality of bit lines BL may extend in parallel to each other. The plurality of bit lines BL may be spaced apart from each other at equal intervals.

As the design rule of the semiconductor device decreases, as shown in FIG. 1, the active region AR may be formed in a diagonal bar shape. For example, the active region AR may extend in the first direction DR1, and the word line WL may extend in the second direction DR2 to form a first acute angle θ1 with respect to the first direction DR1. In an implementation, the bit line BL may extend in a third direction DR3 perpendicular to the second direction DR2.

In an implementation, the first acute angle θ1 may be 60°. In an implementation, a plurality of capacitor structures 300 may be arranged in the form of honeycombs. In an implementation, the plurality of capacitor structures 300 may be arranged in various forms.

The device isolation layer 110 may be formed in the substrate 100. In addition, the device isolation layer 110 may define an active region in the substrate 100. In an implementation, as illustrated in FIGS. 2 and 3, the sidewall of the device isolation layer 110 may be perpendicular to the bottom surface of the device isolation layer 110. In an implementation, in consideration of an actual process of forming the device isolation layer 110, the sidewall of the device isolation layer 110 may have an inclination.

In an implementation, the device isolation layer 110 may include, e.g., at least one of silicon oxide, silicon nitride, silicon oxynitride, or a combination thereof. The device isolation layer 110 may be a single layer made of one kind of insulating material, or may be a multilayer made of a combination of several kinds of insulating materials. For simplicity of description, hereinafter, the device isolation layer 110 is described as including silicon oxide.

The gate trench GT may be formed in the substrate 100. The gate trench GT may extend across the active region AR and the device isolation layer 110. For example, the gate trench GT may extend in the second direction DR2. The gate trench GT may include a first trench P1 extending in the second direction DR2 in the active region AR and a second trench P2 extending in the second direction DR2 in the device isolation layer 110. As used herein, the use of the terms "first" and "second" with respect to the elements is merely for ease of naming, rather than an additive list of elements that would all be required.

In an implementation, as illustrated in FIG. 2, the sidewall of the gate trench GT may have an inclination, or may have another orientation.

In an implementation, the second trench P2 may be formed to have a depth greater than that of the first trench P1. For example, as illustrated in FIG. 2, the depth of the second trench P2 may be greater than the depth of the first trench P1 with respect to the top surface of the substrate 100. Accordingly, the bottom surface of the second trench P2 may be lower than the bottom surface of the first trench P1.

A main gate electrode structure MGS may include a main gate electrode MG and a first barrier conductive layer 160*a*.

A pass gate electrode structure PGS may include a pass gate electrode PG and a second barrier conductive layer 160*b*.

The gate electrode 120 may include the main gate electrode MG filling a portion of the first trench P1 and the pass gate electrode PG filling a portion of the second trench P2. For example, the main gate electrode MG may be a portion of the gate electrode 120 crossing the active region AR, and the pass gate electrode PG may be a portion of the gate electrode 120 crossing the device isolation layer 110.

The gate electrode 120 may extend (e.g., lengthwise) in the second direction DR2. The gate electrode 120 may function as the word line WL of FIG. 1. The gate electrode 120 may be formed in the gate trench GT. For example, the gate electrode 120 may fill a lower portion of the gate trench GT.

The gate electrode 120 may include a conductive material. For example, the gate electrode 120 may include titanium (Ti), tantalum (Ta), tungsten (W), aluminum (Al), cobalt (Co), or combinations thereof. In an implementation, the gate electrode 120 may include polysilicon, silicon germanium, or the like, rather than metal.

The second trench P2 may be formed to have a depth greater than that of the first trench P1, and the bottom surface of the pass gate electrode PG may be lower than the bottom surface of the main gate electrode MG.

In an implementation, the active region AR may include a first source/drain region 105*a* including impurities of a second conductivity type (e.g., n-type) different from the first conductivity type and a second source/drain region 105*b*.

The first source/drain region 105*a* and the second source/drain region 105*b* may be formed at both sides of the main gate electrode MG, respectively. For example, as illustrated in FIGS. 1 and 2, the first source/drain region 105*a* may be formed at the center of the active region AR, and the second source/drain regions 105*b* may be formed at both ends of the active region AR. In an implementation, two main gate electrodes MG may share one first source/drain region 105*a*.

The gate insulating layer 130 may include a first gate insulating layer 130*a* in the first trench P1 and a second gate insulating layer 130*b* in the second trench P2. For example, a portion of the first gate insulating layer 130*a* may be between the active region AR and the main gate electrode MG, and a portion of the second gate insulating layer 130*b* may be between the device isolation layer 110 and the pass gate electrode PG.

For example, the first gate insulating layer 130*a* may extend along the bottom surface and the sidewall of the main gate electrode MG, and the second gate insulating layer 130*b* may extend along the bottom surface and the sidewall of the pass gate electrode PG.

The first gate insulating layer 130*a* may extend along the bottom surface and the sidewall of the first trench P1, and the second gate insulating layer 130*b* may extend along the bottom surface and the sidewall of the second trench P2 to extend along the top surface of the pass gate electrode PG.

The gate insulating layer 130 may include, e.g., silicon oxide, silicon nitride, silicon oxynitride, or a high dielectric constant (high-k) material having a higher dielectric constant than that of silicon oxide. In an implementation, the high-k material may include, e.g., hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobite, or a combination thereof.

A barrier conductive layer 160 may include the first barrier conductive layer 160a filling a portion of the first trench P1 and the second barrier conductive layer 160b filling a portion of the second trench P2.

As illustrated in FIG. 2, the first barrier conductive layer 160a may be between the first gate insulating layer 130a and the main gate electrode MG. For example, the first barrier conductive layer 160a may extend along the bottom surface and the sidewall of the main gate electrode MG.

The second barrier conductive layer 160b may be between the second gate insulating layer 130b and the pass gate electrode PG. For example, the second barrier conductive layer 160b may extend along the bottom surface and the sidewall of the pass gate electrode PG, and may extend along the top surface of the pass gate electrode PG. In an implementation, the second barrier conductive layer 160b may surround the pass gate electrode PG.

The barrier conductive layer 160 may include, e.g., a metal nitride. In an implementation, the barrier layer 160 may include, e.g., titanium nitride (TiN), tungsten nitride (WN), or a combination thereof.

The capping pattern 140 may be on the main gate electrode MG. The capping pattern 140 may fill a portion of the first trench P1. For example, the main gate electrode MG may fill a lower portion of the first trench P1, and the capping pattern 140 may fill an upper portion of the first trench P1. The capping pattern 140 may extend in the second direction DR2 in the first trench P1.

The first gate insulating layer 130a may extend along the sidewall of the capping pattern 140. For example, the first gate insulating layer 130a may extend along the bottom surface and the sidewall of the first barrier conductive layer 160a. In an implementation, the first gate insulating layer 130a may not extend along the top surface of the main gate electrode structure MGS and/or the bottom surface of the capping pattern 140.

In an implementation, the capping pattern 140 may include, e.g., silicon oxide, silicon nitride, silicon oxynitride, or a combination thereof. For simplicity of description, hereinafter, the capping pattern 140 is described as including silicon nitride.

The support structure 150 may be formed above the pass gate electrode PG. The support structure 150 may fill a portion of the second trench P2. For example, the pass gate electrode PG may fill a lower portion of the second trench P2, and the support structure 150 may fill an upper portion of the second trench P2.

The support structure 150 may include a first sidewall S1 and a second sidewall S2 crossing the first sidewall S1. The first sidewall S1 and the second sidewall S2 of the support structure 150 may be connected to each other to form a sidewall of the support structure 150. For example, the support structure 150 may include two first sidewalls S1 facing each other and two second sidewalls S2 facing each other between the two first sidewalls S1.

The first sidewall S1 of the support structure 150 may extend in the second direction DR2. For example, the first sidewall S1 of the support structure 150 may be defined by the sidewall of the second trench P2. In an implementation, the first sidewall S1 of the support structure 150 may be in contact with the inner sidewall of the second gate insulating layer 130b, which extends along the bottom surface and the sidewall of the second trench P2.

The second sidewall S2 of the support structure 150 may extend in a direction crossing the second direction DR2. For example, as shown in FIGS. 1 to 3, the second sidewall S2 of the support structure 150 may be connected to the first sidewall S1 of the support structure 150, and may face the sidewall of the capping pattern 140.

As shown in FIGS. 2 and 3, the support structure 150 may have a second height H2, and the capping pattern 140 may have a first height H1, with respect to the top surface of the substrate 100. In an implementation, the second height H2 may be greater than the first height H1.

In an implementation, the support structure 150 may include, e.g., silicon oxide, silicon nitride, silicon oxynitride, or a combination thereof. For simplicity of description, hereinafter, the support structure 150 is described as including silicon nitride.

In an implementation, the capping pattern 140 and the support structure 150 may include silicon nitride of a different material composition. In an implementation, the support structure 150 may have a lower dielectric constant than the capping pattern 140. The support structure 150 may further alleviate gate-induced drain leakage (GIDL) caused by the pass gate electrode PG, which will be described below, to provide a semiconductor device with improved performance.

A support structure insulating layer 150a may fill a portion of the second trench P2. For example, the support structure insulating layer 150a may extend along the bottom surface and the sidewall of the support structure 150. The support structure insulating layer 150a may be formed using atomic layer deposition (ALD). A description of the atomic layer deposition (ALD) will be given later with reference to FIG. 12.

A connection portion CP may include a portion of the support structure insulating layer 150a having a first thickness T1 and a portion of the second gate insulating layer 130b having a second thickness T2.

A portion of the support structure insulating layer 150a may extend along the bottom surface of the support structure 150, and a portion of the second gate insulating layer 130b may extend along the top surface of the second barrier conductive layer 160b. In an implementation, the support structure insulating layer 150a may have the first thickness T1, the second gate insulating layer 130b may have the second thickness T2, and the first thickness T1 and the second thickness T2 may be different from each other, e.g., because they are formed by different processes (to be described in detail later with reference to FIGS. 12 and 13).

The portion of the support structure insulating layer 150a extending along the bottom surface of the support structure 150 and the portion of the second gate insulating layer 130b extending along the top surface of the second barrier conductive layer 160b may be in direct contact with each other between the support structure 150 and the pass gate electrode structure PGS.

The support structure insulating layer 150a may include, e.g., silicon oxide, silicon nitride, silicon oxynitride, or a high dielectric constant (high-k) material having a higher dielectric constant than that of silicon oxide. In an implementation, the high-k material may include, e.g., hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobite, or a combination thereof.

In an implementation, the support structure insulating layer 150a and the second gate insulating layer 130b may be formed separately in different processes as described above, and they may include an oxide of different material composition.

The first interlayer insulating layer 200 and the second interlayer insulating layer 210 may be sequentially stacked on the substrate 100. In an implementation, only two interlayer insulating layers 200 and 210 may be formed on the substrate 100. In an implementation, three or more interlayer insulating layers may be formed on the substrate 100.

The first interlayer insulating layer 200 and the second interlayer insulating layer 210 may include, e.g., silicon oxide, silicon nitride, or silicon oxynitride.

A contact structure BC may include a first contact structure 220 and a second contact structure 230. As shown in FIG. 1, the contact structures BC may be at both ends of the active region AR in the layout.

The first contact structure 220 may be connected to the first source/drain region 105a. For example, the first contact structure 220 may be connected to the first source/drain region 105a through the first interlayer insulating layer 200.

The second contact structure 230 may be connected to the second source/drain region 105b. For example, the second contact structure 230 may be connected to the second source/drain region 105b through the first interlayer insulating layer 200 and the second interlayer insulating layer 210.

Each of the first contact structure 220 and the second contact structure 230 may include a conductive material. In an implementation, the first contact structure 220 and the second contact structure 230 may include a metal, e.g., titanium (Ti), tantalum (Ta), tungsten (W), aluminum (Al), and cobalt (Co), or combinations thereof. In an implementation, the first contact structure 220 and the second contact structure 230 may include, e.g., polysilicon or silicon germanium, rather than a (e.g., pure) metal.

Each of the first contact structure 220 and the second contact structure 230 may be a single layer made of one kind of conductive material, or may be a multilayer made of a combination of several kinds of conductive materials. For example, the second contact structure 230 may be a multilayer including a polysilicon layer and a metal layer that are sequentially stacked on the second source/drain region 105b.

A portion of the bit line BL may be connected to the first contact structure 220. For example, the bit line BL may be on the top surface of the first interlayer insulating layer 200 and the top surface of the first contact structure 220. The bit line BL may be electrically connected to the first source/drain region 105a. The bit line BL may be a single layer made of one kind of conductive material, or may be a multilayer made of a combination of several kinds of conductive materials.

The capacitor structure 300 may store electric charges in a semiconductor device (e.g., a semiconductor memory device) according to some embodiments. For example, the capacitor structure 300 may include a lower electrode 310, a capacitor dielectric layer 320, and an upper electrode 330. The capacitor structure 300 may store electric charges in the capacitor dielectric layer 320 by using a potential difference generated between the lower electrode 310 and the upper electrode 330.

In an implementation, the lower electrode 310 and the upper electrode 330 may include, e.g., doped polysilicon, a metal, or a metal nitride.

In an implementation, the capacitor dielectric layer 320 may include, e.g., silicon oxide or a high dielectric constant material.

If the source/drain region and the gate electrode were to be adjacent to each other, a strong electric field could be generated therebetween. Accordingly, direct tunneling between the source/drain region and the gate electrode could occur, and the resultant leakage current is referred to as gate-induced drain leakage (GIDL).

As a semiconductor device becomes highly integrated, such gate-induced drain leakage could occur not only by the main gate electrode but also by the pass gate electrode. The semiconductor device according to some embodiments may help prevent the gate-induced drain leakage by arranging the pass gate electrode PG to be lower than the main gate electrode MG. The gate-induced drain leakage may depend on the overlapping area of the source/drain region and the gate electrode, and the pass gate electrode PG being lower than the main gate electrode MG may help reduce the overlapping area.

As shown in FIGS. 2 and 3, the capping pattern 140 may have the first height H1, and the support structure 150 may have the second height H2. The first height H1 refers to a distance from the top surface to the bottom surface of the capping pattern 140, and the second height H2 refers to a distance from the top surface to the bottom surface of the support structure 150 (e.g., as measured in a same direction as the first height H1, a vertical direction as illustrated in FIG. 2).

As described above, the first height H1 may be smaller than the second height H2. For example, the pass gate electrode PG may be lower than the main gate electrode MG. It is possible to help prevent the gate-induced drain leakage.

When the maximum width of the capping pattern 140 is defined as a first width W1 (e.g., in a horizontal direction orthogonal to the vertical direction in FIG. 2) and the maximum width of the support structure is defined as a second width W2, the first width W1 and the second width W2 may be different from each other. As described above, a process of depositing the first gate insulating layer 130a in the first trench P1 and a process of depositing the support structure insulating layer 150a in the second trench P2 may be separate. Accordingly, the thickness of the first gate insulating layer 130a filling the first trench P1 may be different from the thickness of the supporting structure insulating layer 150a filling the upper portion of the second trench P2 (the process will be described below in detail with reference to FIGS. 12 and 13). For example, the first width W1 and the second width W2 may vary.

The semiconductor device according to some embodiments may include the support structure 150 above the pass gate electrode PG. The support structure 150 may support the second trench P2 in which the pass gate electrode PG is embedded. For example, the support structure 150 may help prevent the second trench P2 from being bent, even when an aspect ratio of the second trench P2 is large. It is possible to provide a semiconductor device with improved reliability and performance.

Figure 4:
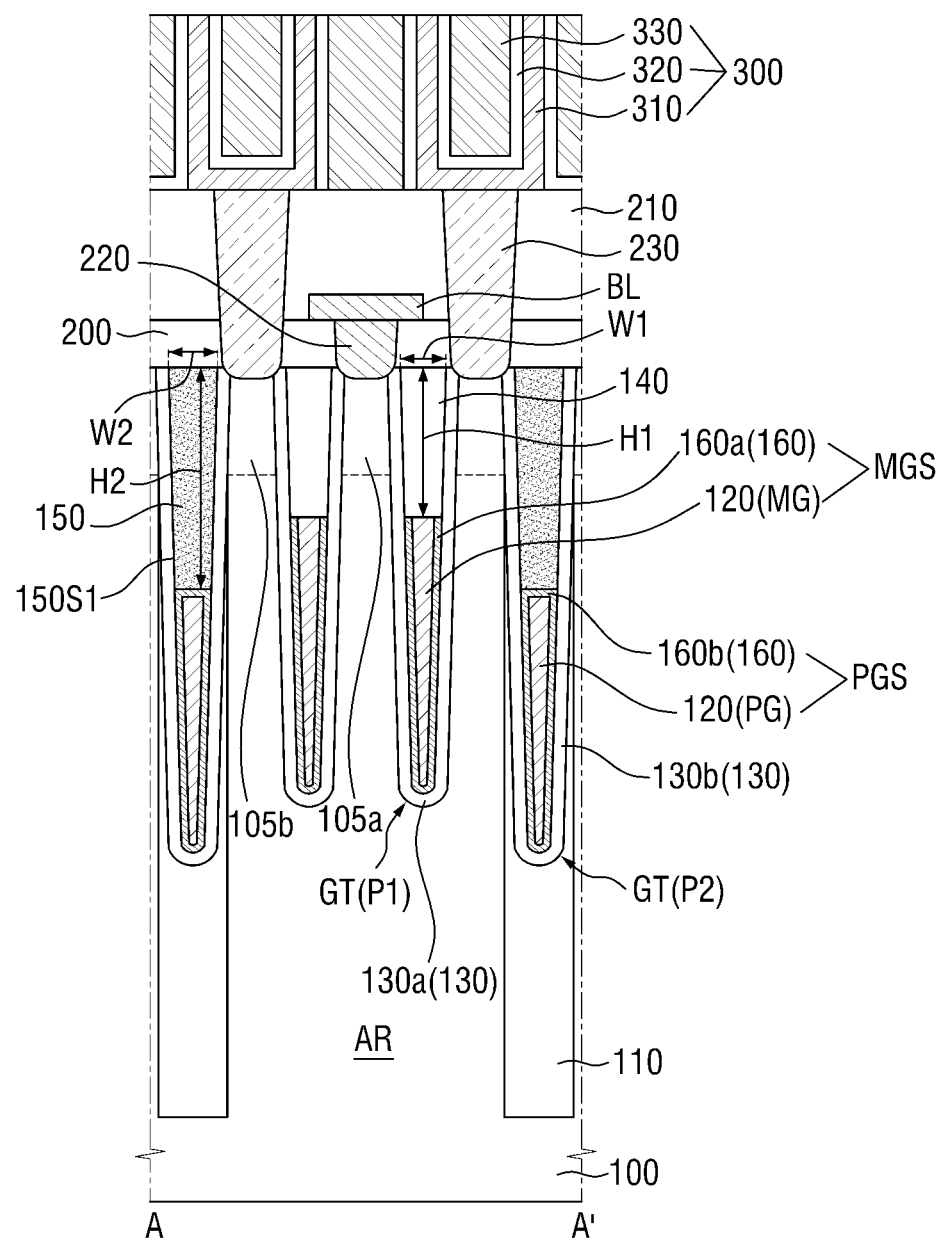
FIGS. 4 and 5 illustrate cross-sectional views a semiconductor device according to some embodiments.
Figure 5:
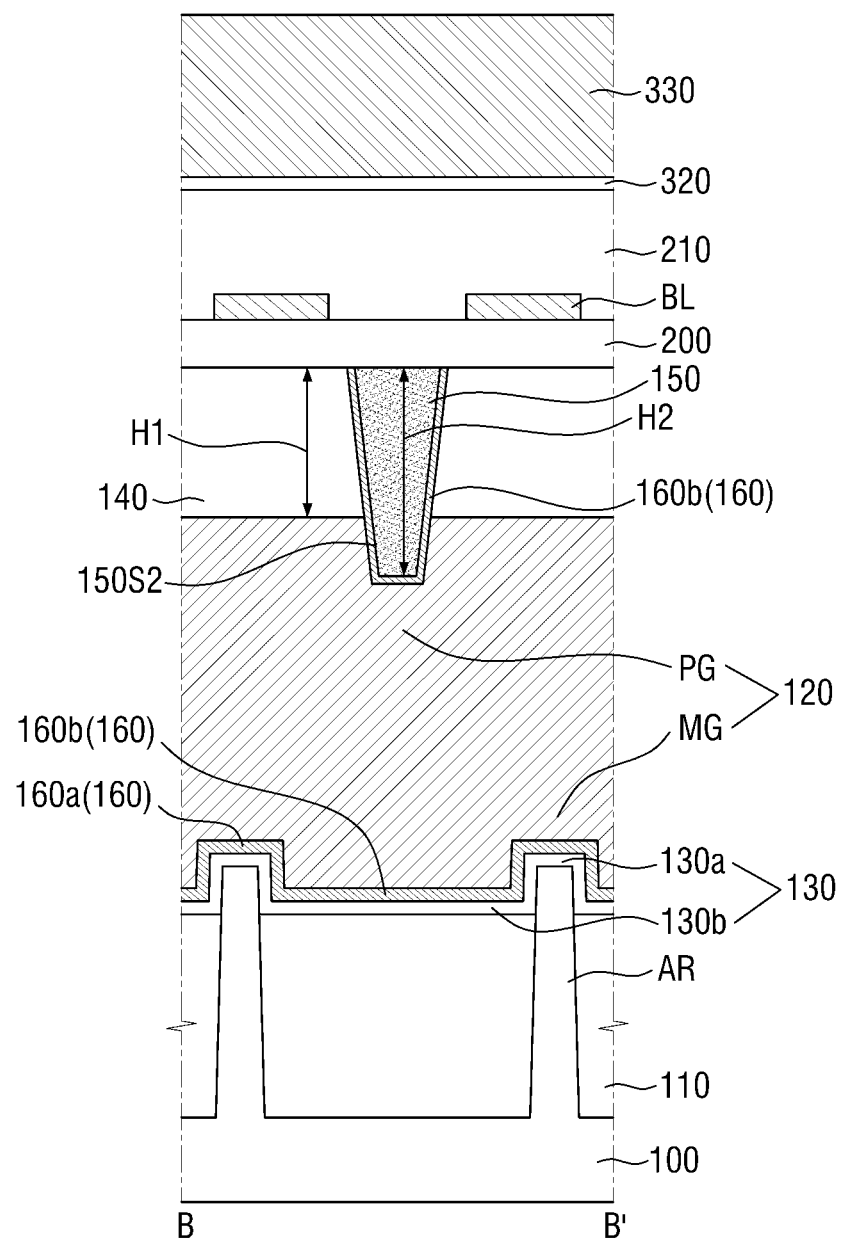

FIGS. 4 and 5 illustrate cross-sectional views a semiconductor device according to some embodiments. FIG. 4 is a cross-sectional view taken along line A-A' of FIG. 1. FIG. 5 is a cross-sectional view taken along line B-B' of FIG. 1. For simplicity of description, a repeated description overlapping with the description with reference to FIGS. 1 to 3 may be briefly given or omitted.

Referring to FIGS. 1, 4, and 5, the first gate insulating layer 130*a* may extend along the sidewall and the bottom surface of the first trenches P1. The second gate insulating layer 130*b* may extend along the sidewall and the bottom surface of the second trench P2.

For example, the second gate insulating layer 130*b* may not extend along the upper surface of the pass gate electrode PG and the lower surface of the support structure 150. Only the second barrier conductive layer 160*b* may be between the support structure 150 and the pass gate electrode PG.

Unlike the embodiment illustrated in FIGS. 2 and 3, the first gate insulating layer 130*a* and the second gate insulating layer 130*b* may be simultaneously formed in the gate trench GT, and the first width W1 and the second width W2 may be substantially the same.

Figure 6:
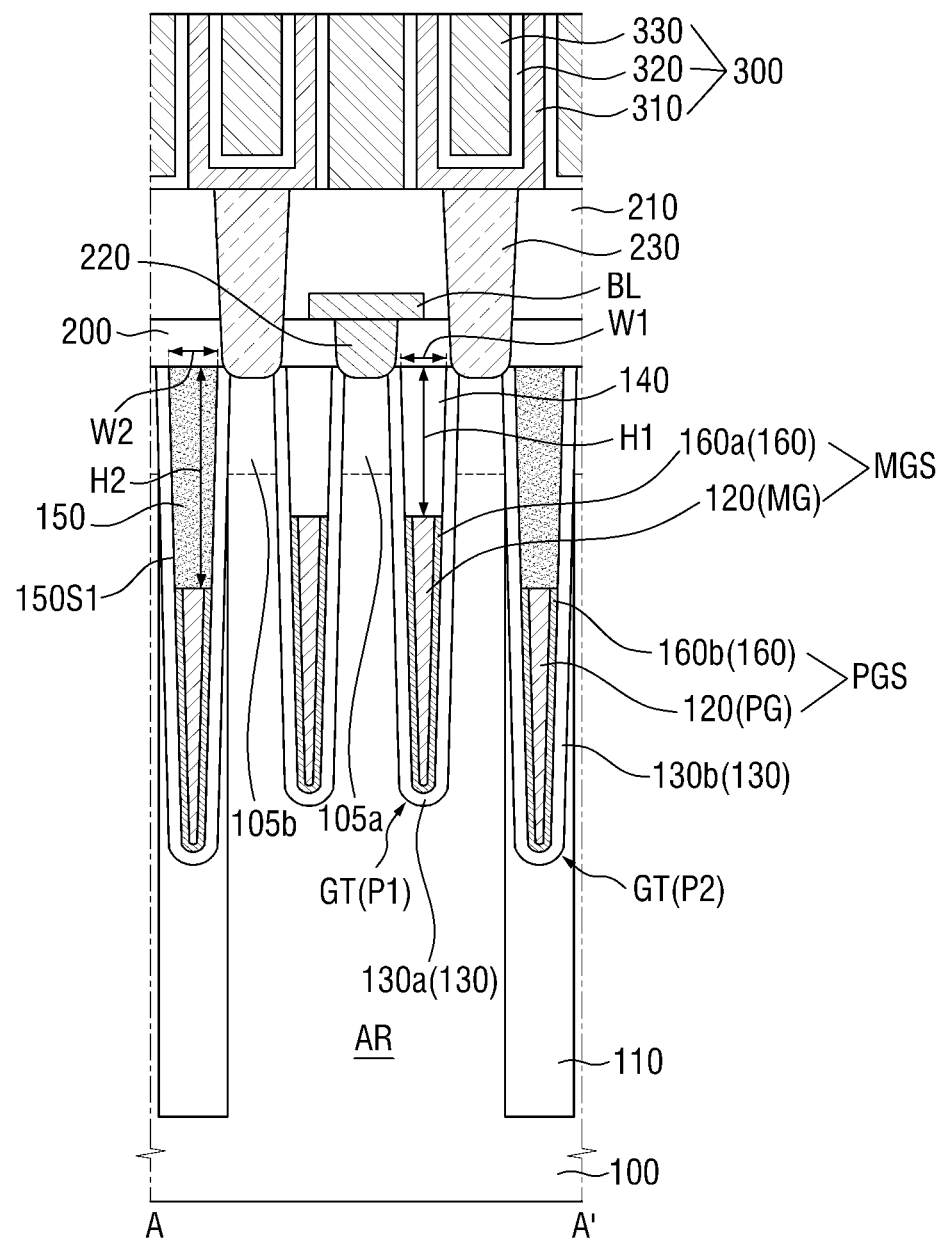
FIGS. 6 and 7 illustrate cross-sectional views of a semiconductor device according to some embodiments.
Figure 7:
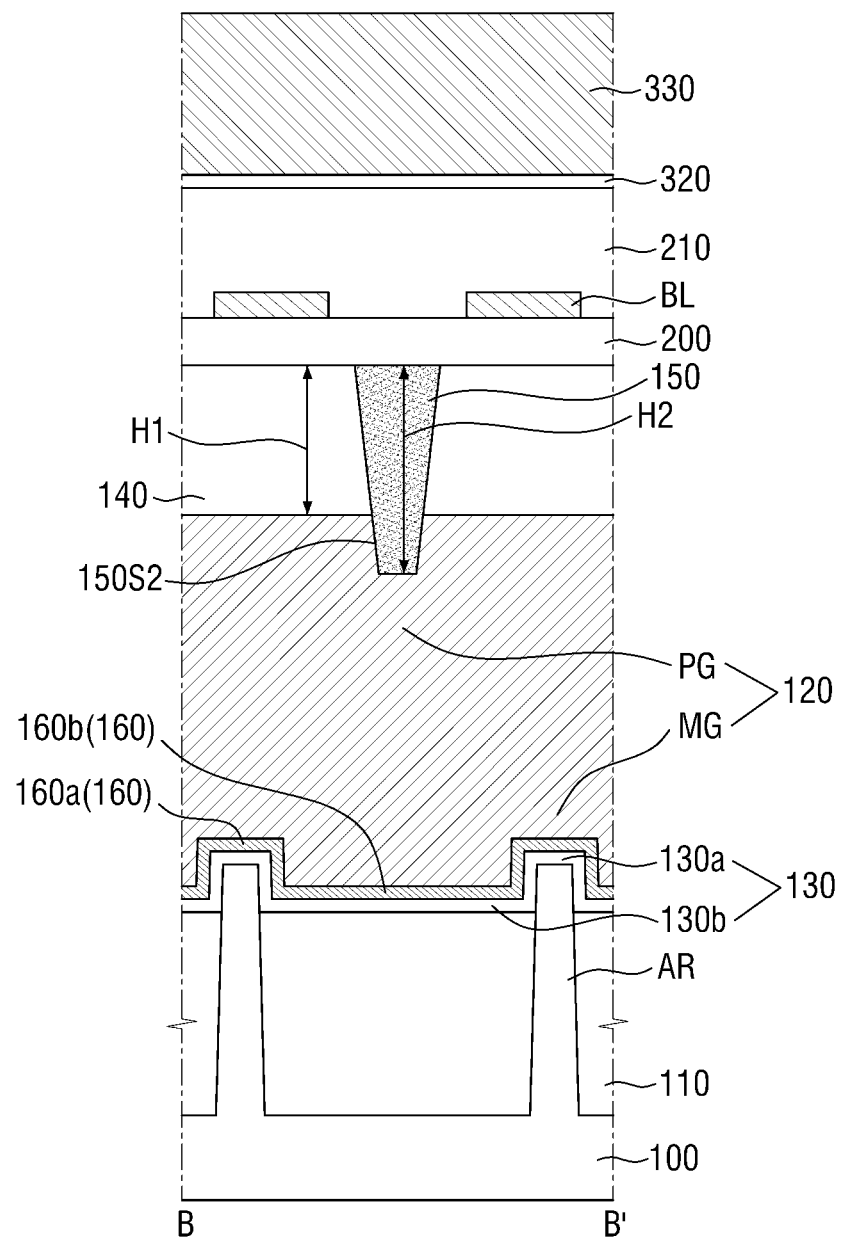

FIGS. 6 and 7 illustrate cross-sectional views of a semiconductor device according to some embodiments. FIG. 6 is a cross-sectional view taken along line A-A' of FIG. 1. FIG. 7 is a cross-sectional view taken along line B-B' of FIG. 1. For simplicity of description, a repeated description overlapping with the description with reference to FIGS. 1 to 5 may be briefly given or omitted.

Referring to FIGS. 1, 6, and 7, in the semiconductor device according to some embodiments, the second barrier conductive layer 160*b* may not extend between the support structure 150 and the pass gate electrode PG.

For example, the second barrier conductive layer 160*b* may extend along the bottom surface and the sidewall of the pass gate electrode PG. The second barrier conductive layer 160*b* may be between the second gate insulating layer 130*b* and the pass gate electrode PG.

The second gate insulating layer 130*b* may extend along the outer sidewall and the bottom surface of the second barrier conductive layer 160*b* and may cover the sidewall of the support structure 150.

Unlike the embodiment illustrated in FIGS. 2 and 3, the first gate insulating layer 130*a* and the second gate insulating layer 130*b* may be simultaneously formed in the gate trench GT, the first width W1 and the second width W2 may be substantially the same.

FIGS. 8 to 16 illustrate stages in a method of manufacturing a semiconductor device according to some embodiments. Specifically, FIGS. 8 to 16 are cross-sectional views taken along line A-A' of FIG. 1. For simplicity of description, a repeated description overlapping with the description with reference to FIGS. 1 to 3 may be briefly given or omitted.

Figure 8:
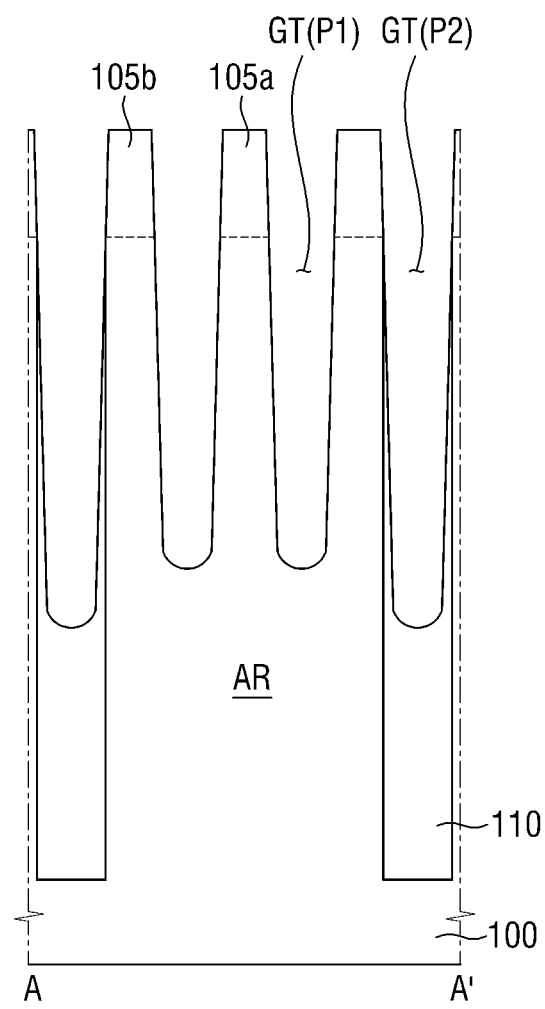
FIGS. 8 to 16 illustrate stages in a method of manufacturing a semiconductor device according to some embodiments.

Referring to FIGS. 1 and 8, the gate trench GT may be formed in the substrate 100. The gate trench GT may be formed to cross the active region AR and the device isolation layer 110. For example, the gate trench GT may be formed to extend in the second direction DR2. The gate trench GT may include the first trench P1 extending in the second direction DR2 in the active region AR and the second trench P2 extending in the second direction DR2 in the device isolation layer 110.

As illustrated in FIG. 8, the second trench P2 may be formed to be deeper than the first trench P1. For example, the depth of the second trench P2 may be greater than the depth of the first trench P1, with respect to the top surface of the substrate 100.

Figure 9:
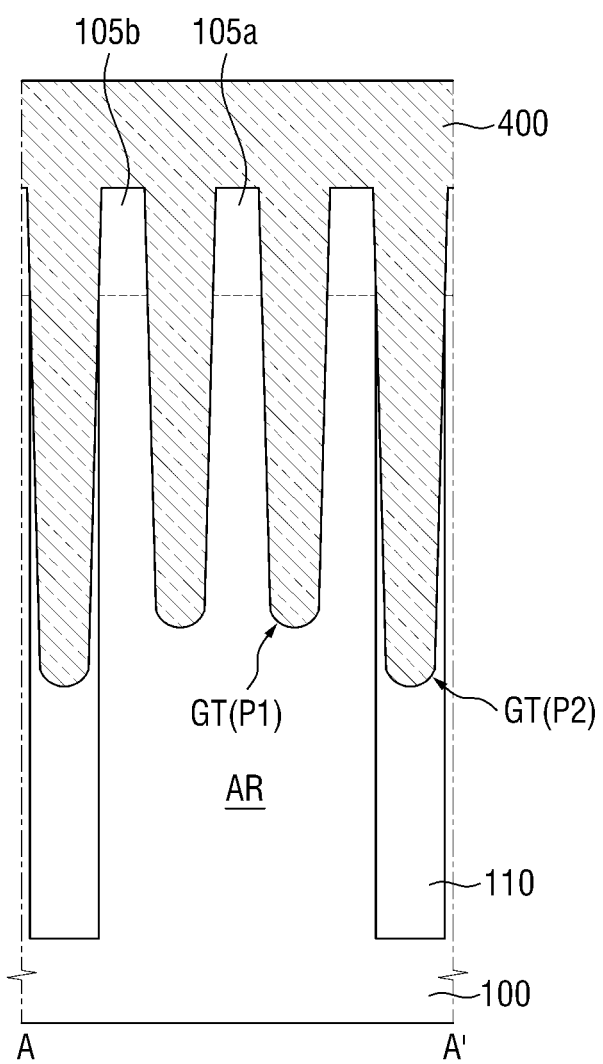

Referring to FIG. 9, a sacrificial layer 400 may be formed on the substrate 100. The sacrificial layer 400 may be formed to fill the gate trench GT. That is, the sacrificial layer 400 may fill the first trench P1 and the second trench P2.

The sacrificial layer 400 filled in the second trench P2 may be formed to be (e.g., may extend) deeper than the sacrificial layer filled in the first trench P1, with respect to the upper surface of the substrate 100.

The sacrificial layer 400 may include a material having an etch selectivity with respect to the support structure 150, which will be described below. In an implementation, the sacrificial layer 400 may include, e.g., a spin-on hardmask (SOH).

Figure 10:
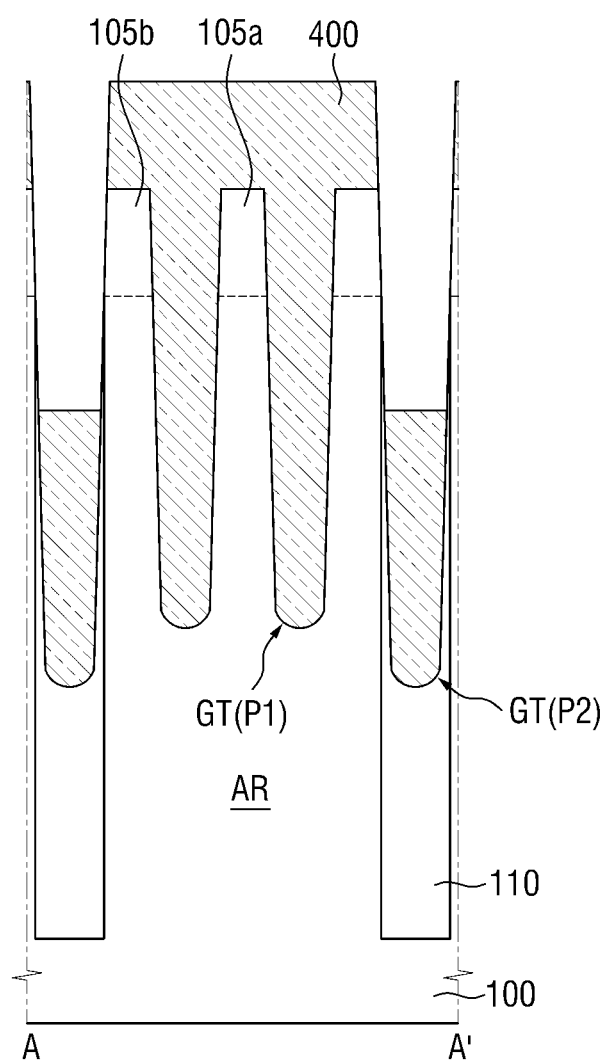

Referring to FIG. 10, openings may be formed at both ends of the active region AR using a mask pattern to expose portions of the sacrificial layer 400. For example, the sacrificial layer 400 on the device isolation layer 110 may be etched. The sacrificial layer 400 on the active region AR may not be etched.

Figure 11:
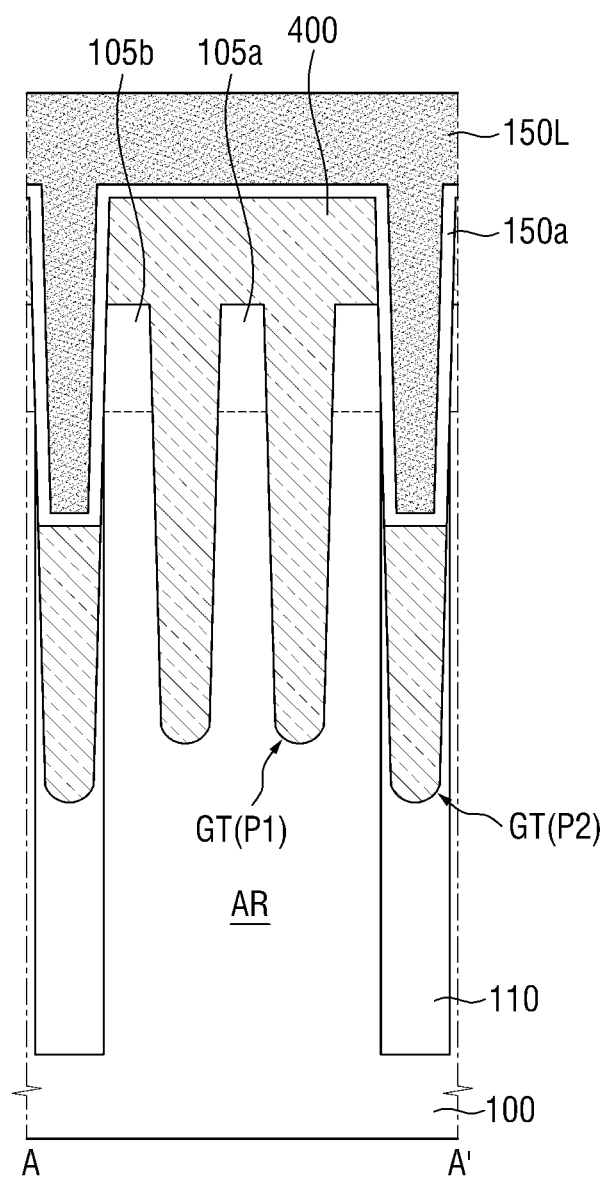

Referring to FIG. 11, first, the support structure insulating layer 150*a* may be deposited in openings on the device isolation layer 110. Forming the support structure insulating layer 150*a* in openings that expose portions of the sacrificial layer 400 may include performing an atomic layer deposition (ALD) process.

Unlike physical vapor deposition (PVD) or chemical vapor deposition (CVD), in the atomic layer deposition (ALD), a thin film may be formed only by a complete surface reaction. It may be an optimal method to obtain an excellent thin film in the thin film design rules.

The support structure insulating layer 150*a* may be formed along both sidewalls and bottom surfaces of the openings exposing portions of the sacrificial layer 400 in the device isolation layer 110 and on the top surface of the sacrificial layer 400 in the active region AR.

In an implementation, the support structure insulating layer 150*a* may include, e.g., silicon oxide, silicon nitride, silicon oxynitride, or a high dielectric constant (high-k) material having a higher dielectric constant than that of silicon oxide. For simplicity of description, hereinafter, the support structure insulating layer 150*a* may be described as including silicon oxide.

After the support structure insulating layer 150*a* is formed, a support insulating layer 150L may be formed to fill the openings on the support structure insulating layer 150*a*.

In an implementation, the support insulating layer 150L may include, e.g., silicon oxide, silicon nitride, silicon oxynitride, or a combination thereof. For simplicity of description, hereinafter, the support insulating layer 150L may be described as including silicon nitride.

Figure 12:
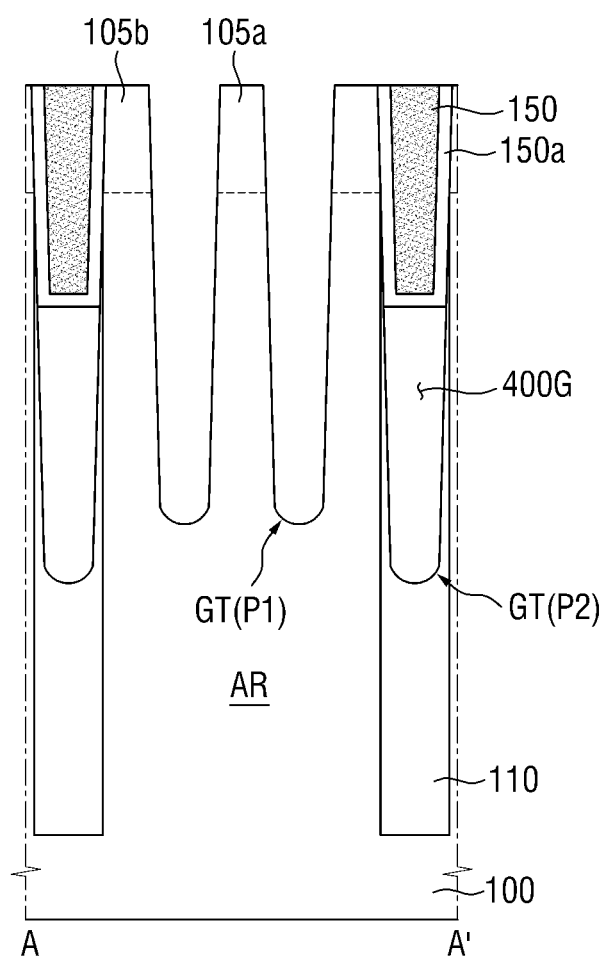

Referring to FIGS. 11 and 12, the support structure 150 may be formed on the support structure insulating layer 150*a*, e.g., in the second trench P2.

For example, a planarization process may be performed on the support insulating layer 150L and the support structure insulating layer 150*a*. The planarization process may be performed, e.g., until the top surface of the substrate 100 is exposed.

After the planarization process is performed, the sacrificial layer 400 may be removed. For example, an ashing process and/or a strip process may be performed on the sacrificial layer 400. The ashing process may be performed using, e.g., H2/N2. The sacrificial layer 400 may have an etch selectivity with respect to the support structure 150, and the support structure 150 may not be removed while the sacrificial layer 400 is removed.

Accordingly, the support structure 150 may remain in an upper portion of the second trench P2. In addition, a gap 400G for the pass gate electrode may be formed in a lower portion of the second trench P2.

Figure 13:
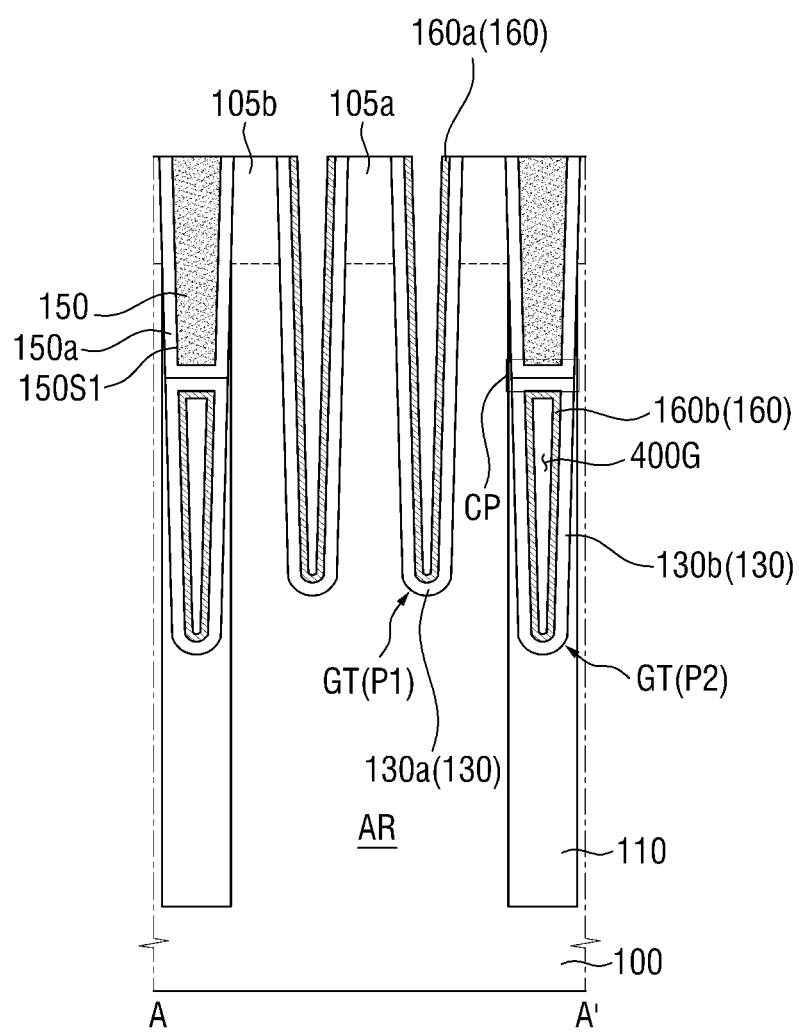

Referring to FIG. 13, the gate insulating layer 130 may be formed in the gate trench GT. For example, the first gate insulating layer 130a may be formed along the bottom surface and the sidewall of the first trench P1. The second gate insulating layer 130b may be formed along the bottom surface and a portion of the sidewall of the second trench P2.

The support structure insulating layer 150a may already cover the bottom surface and the sidewall of the support structure 150, and the second gate insulating layer 130b may be formed below the support structure 150 along the bottom surface of the support structure insulating layer 150a and a portion of the sidewall and the bottom surface of the second trench P2.

As described above, the support structure insulating layer 150a and the second gate insulating layer 130b may be formed by different processes, and they may have different thicknesses in or at the connection portion CP where the support structure insulating layer 150a and the second gate insulating layer 130b are in contact with each other.

Similarly, the materials of the support structure insulating layer 150a and the second gate insulating layer 130b may also include different oxides.

After the first gate insulating layer 130a is formed, the first barrier conductive layer 160a may be formed along the first gate insulating layer 130a in the first trench P1.

After the second gate insulating layer 130b is formed, the second barrier conductive layer 160b may be formed along the inner wall of the second gate insulating layer 130b in the second trench P2. Even after the second barrier conductive layer 160b is formed, at least a part of the gap 400G for the pass gate electrode may be maintained.

Figure 14:
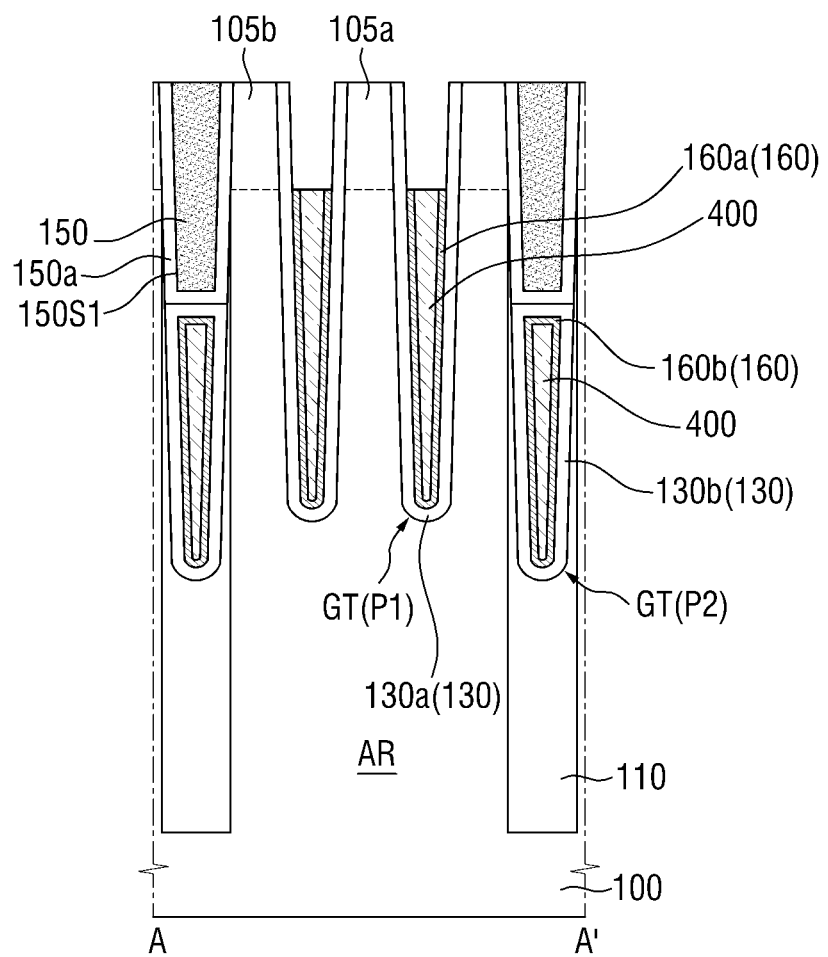

Referring to FIG. 14, after the resultant structure of FIG. 13 is obtained, another sacrificial layer 400' may fill the inside of the first trench P1 and the inside of the second trench P2. After forming the other sacrificial layer 400', an ashing process and an etching process may be performed to remove a part of the other sacrificial layer 400' and the first barrier conductive layer 160a of the upper portion of the first trench P1.

Figure 15:
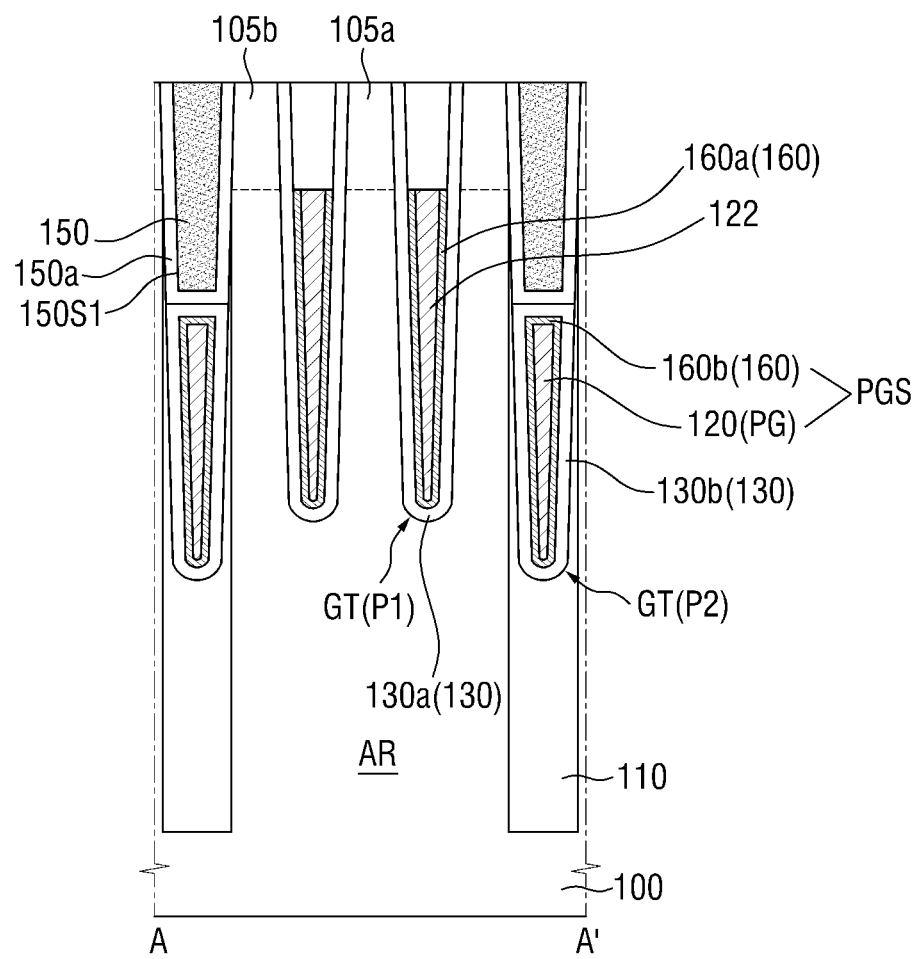
Figure 16:
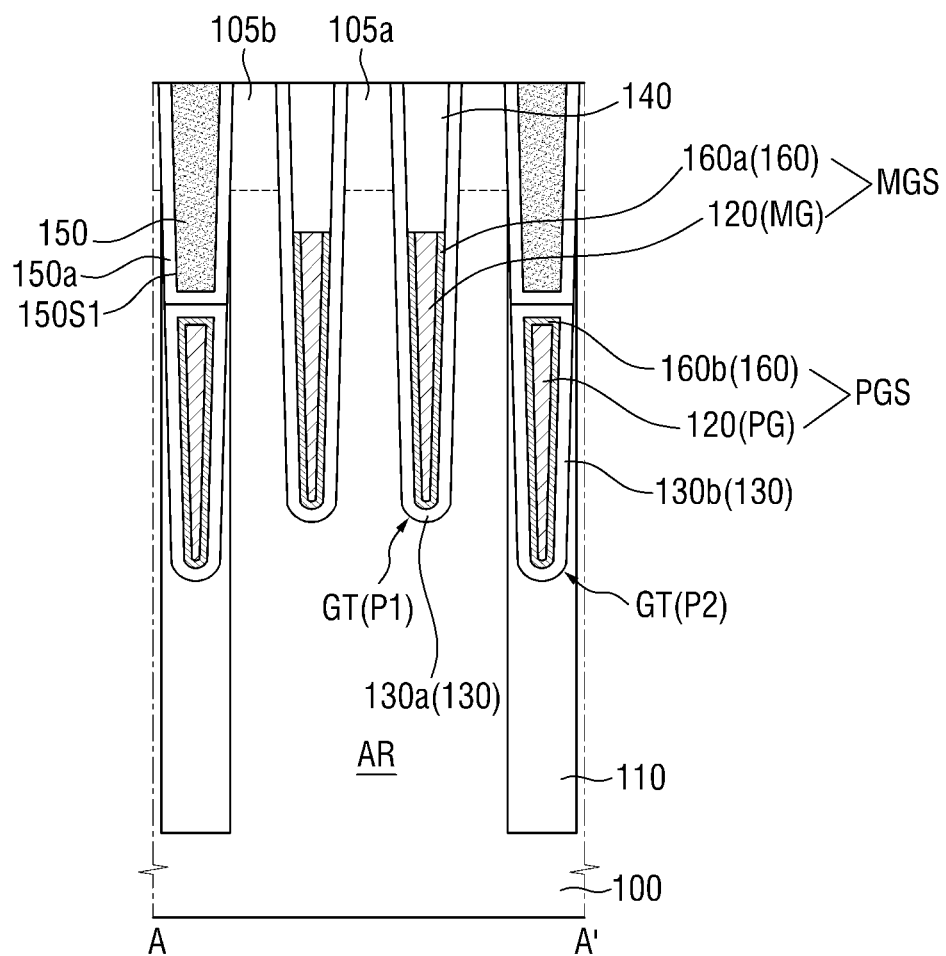

Referring to FIGS. 15 and 16, after the resultant structure of FIG. 14 is obtained, the sacrificial layer 400 may be removed. After the sacrificial layer 400 is removed, a filling conductive layer 122 and the pass gate electrode PG may fill a space in the gate trench GT. Then, a planarization process may be performed on the filling conductive layer 122 until the top surface of the substrate 100 is exposed.

Thereafter, the capping pattern 140 may be formed in the upper portion of the first trench P1 through a series of steps. The series of steps may include performing a metal etch back process, a LaO deposition process, and a deposition process of the filling conductive layer 122 on the resultant structure of FIG. 15, performing a planarization process, and then performing a metal etch back process again.

FIGS. 17 to 24 illustrate stages in a method of manufacturing a semiconductor device according to some embodiments. Specifically, FIGS. 17 to 24 are cross-sectional views taken along line A-A' of FIG. 1. For simplicity of description, a repeated description overlapping with the description with reference to FIGS. 1, 4 and 5 may be briefly given or omitted.

Figure 17:
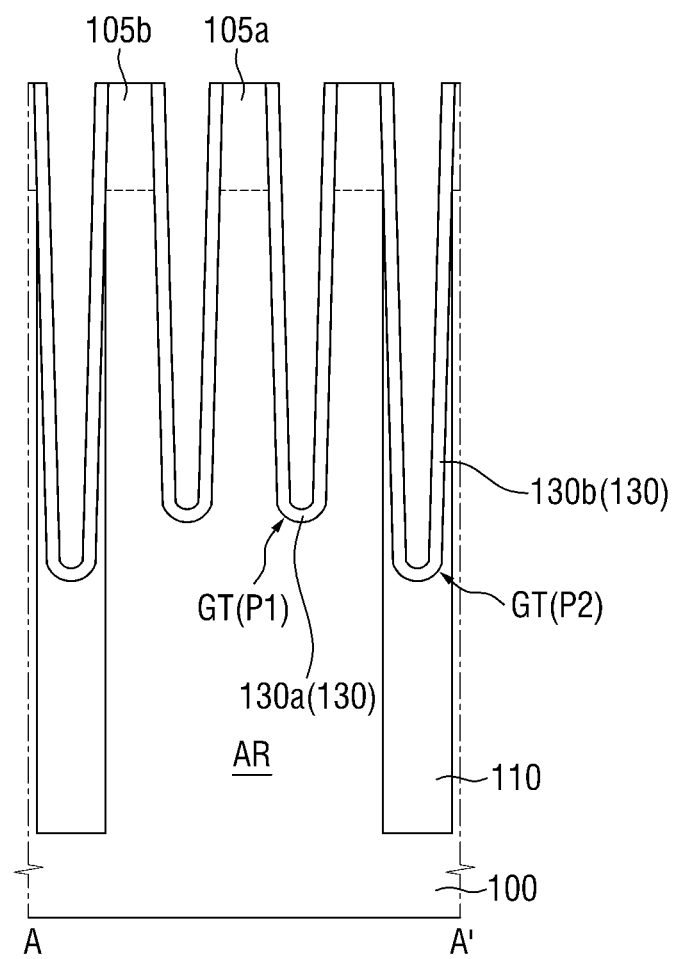
FIGS. 17 to 24 illustrate stages in a method of manufacturing a semiconductor device according to some embodiments.

Referring to FIG. 17, the gate insulating layer 130 may be formed along sidewall and the bottom surface of the gate trench GT.

The first gate insulating layer 130a may be formed along the sidewall and the bottom surface of the first trench P1, and the second gate insulating layer 130b may be formed along the sidewall and the bottom surface of the second trench P2.

Figure 18:
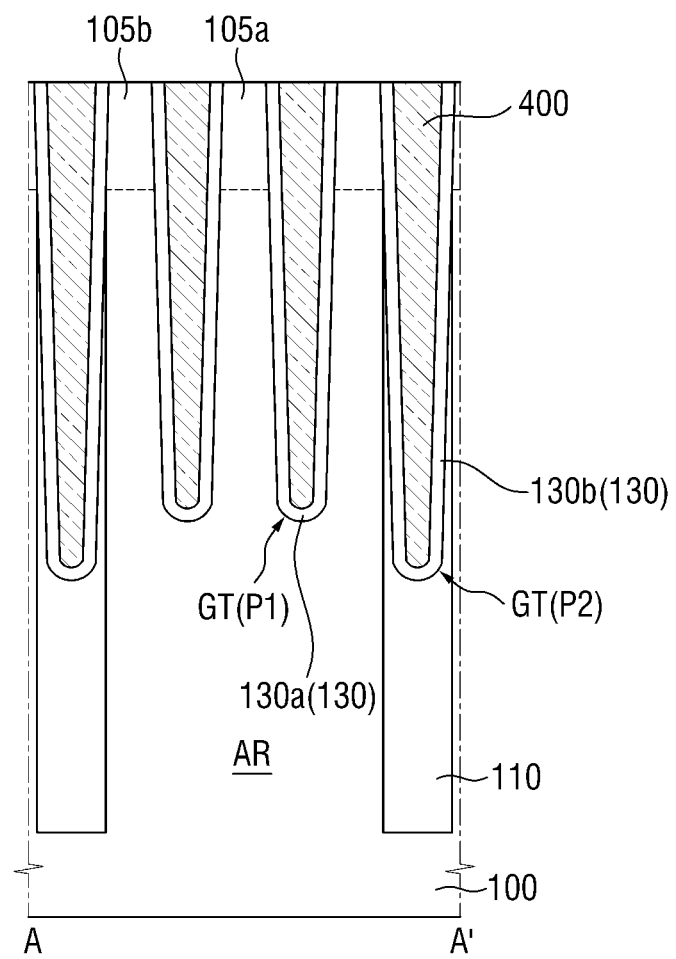

Referring to FIG. 18, the sacrificial layer 400 may be formed in the first trench P1 and the second trench P2. The sacrificial layer 400 may include a material having an etch selectivity with respect to the gate insulating layer 130.

Figure 19:
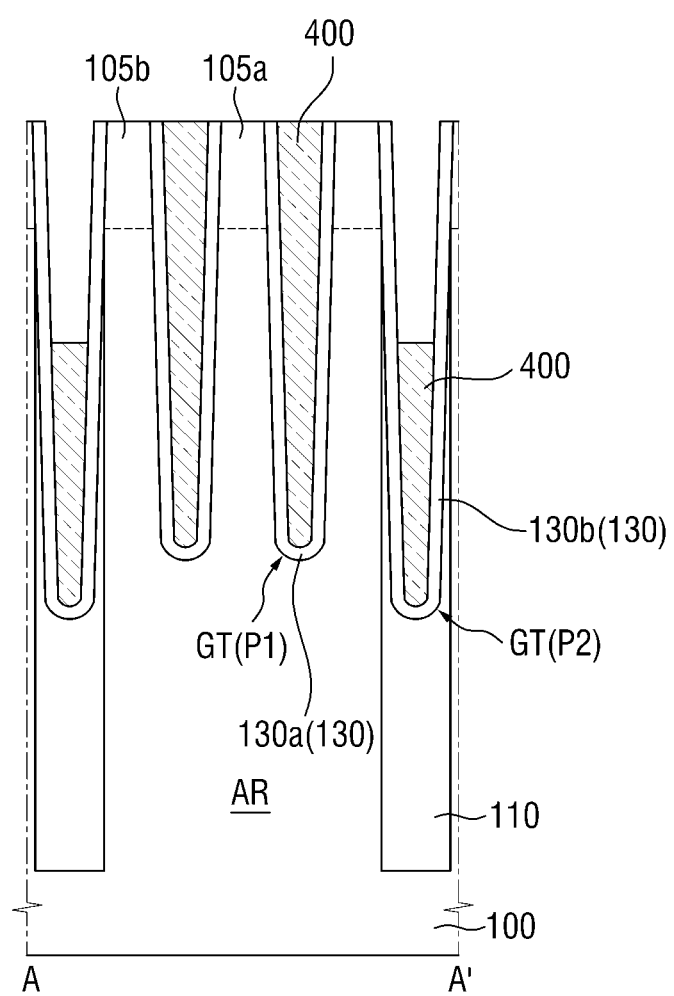

Referring to FIG. 19, the sacrificial layer in the upper portion of the second trench P2 (in the device isolation layer 110) may be selectively removed through an etch back process using a mask pattern.

Accordingly, the support structure 150 to be described below may be formed in the upper portion of the second trench P2 vacated through the etch back process.

The sacrificial layer 400 may be maintained on the first gate insulating layer 130a in the first trench P1 in the active region AR.

Figure 20:
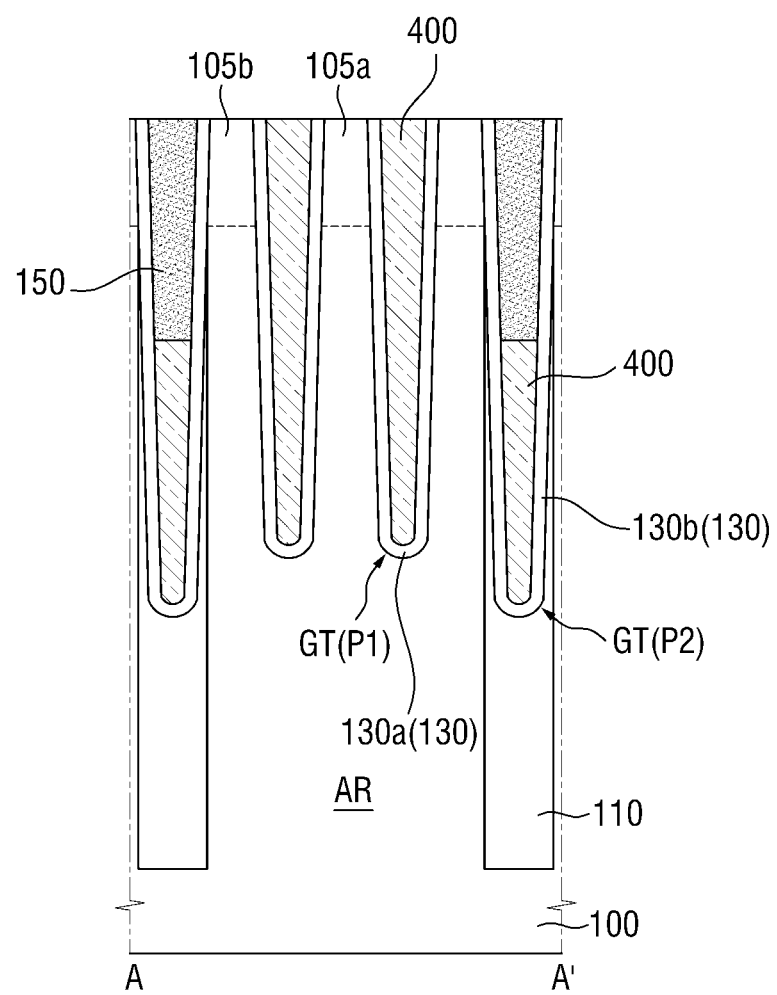

Referring to FIG. 20, the support structure 150 may be formed in the upper portion of the second trench P2 vacated through the etch back process described above. As a result, the second gate insulating layer 130b may cover the sidewall of the support structure 150. The second gate insulating layer 130b may not cover the bottom surface of the support structure 150. This is because the support structure 150 is formed after the second gate insulating layer 130b is formed.

As a result, the sacrificial layer 400 in the lower portion of the second trench P2 may be in contact with the bottom surface of the support structure 150.

Figure 21:
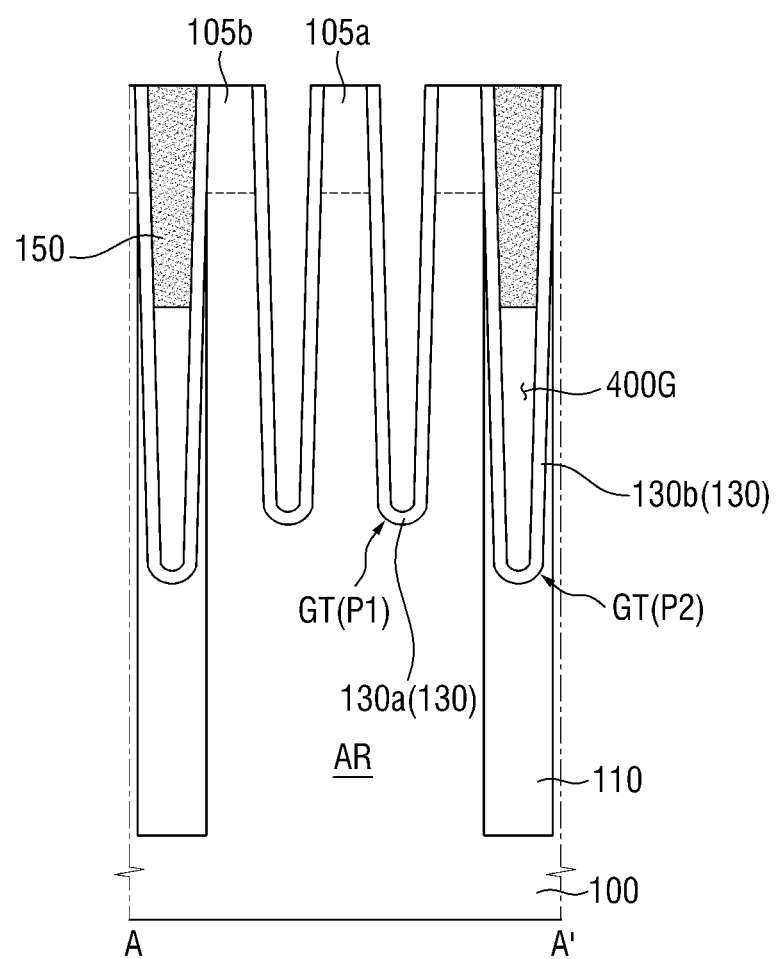

Referring to FIGS. 20 and 21, the sacrificial layer 400 in the first trench P1 and the sacrificial layer 400 in the lower portion of the second trench P2 may be removed through an ashing process and a strip process.

Accordingly, the gap 400G for the pass gate electrode may be formed in the lower portion of the second trench P2, and only the first gate insulating layer 130a may remain in the first trench P1.

Figure 22:
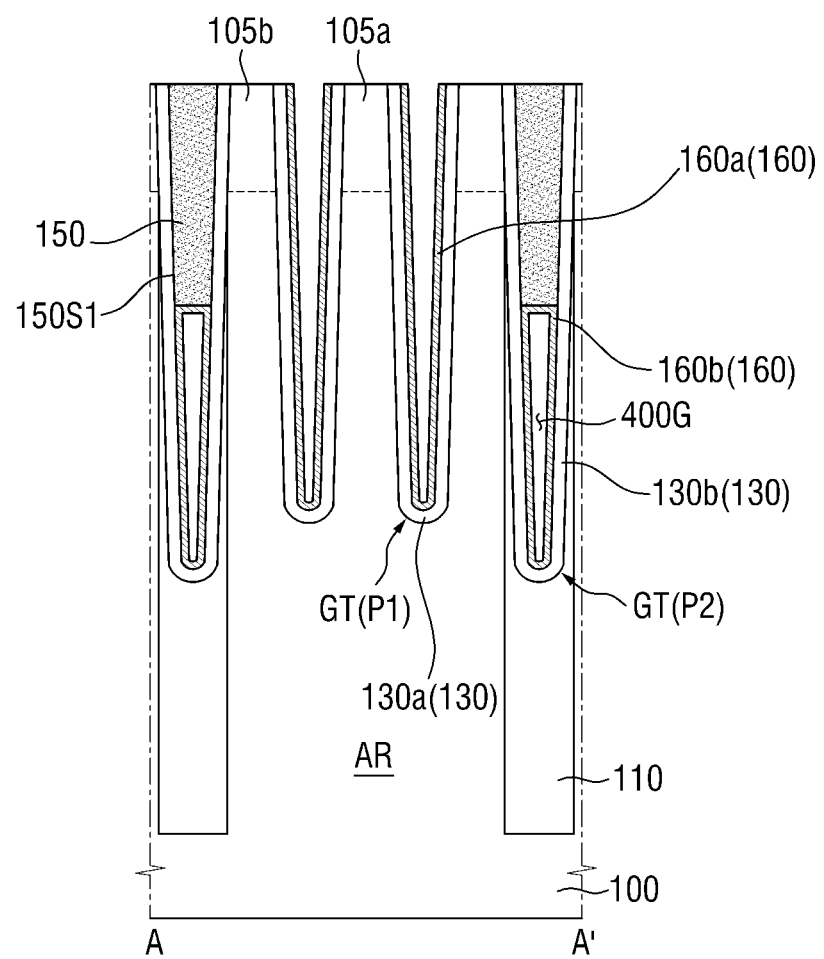

Referring to FIG. 22, the first barrier conductive layer 160a may be formed along the bottom surface and the sidewall of the first gate insulating layer 130a. The second barrier conductive layer 160b may be formed in the lower portion of the second trench P2 along the profile of the sidewall and the bottom surface of the second gate insulating layer and the bottom surface of the support structure 150.

For example, the second barrier conductive layer 160b may extend along the bottom surface of the support structure 150 and may extend along the bottom surface and the inner wall of the second gate insulating layer 130b. The gap 400G for the pass gate electrode may become smaller.

Figure 23:
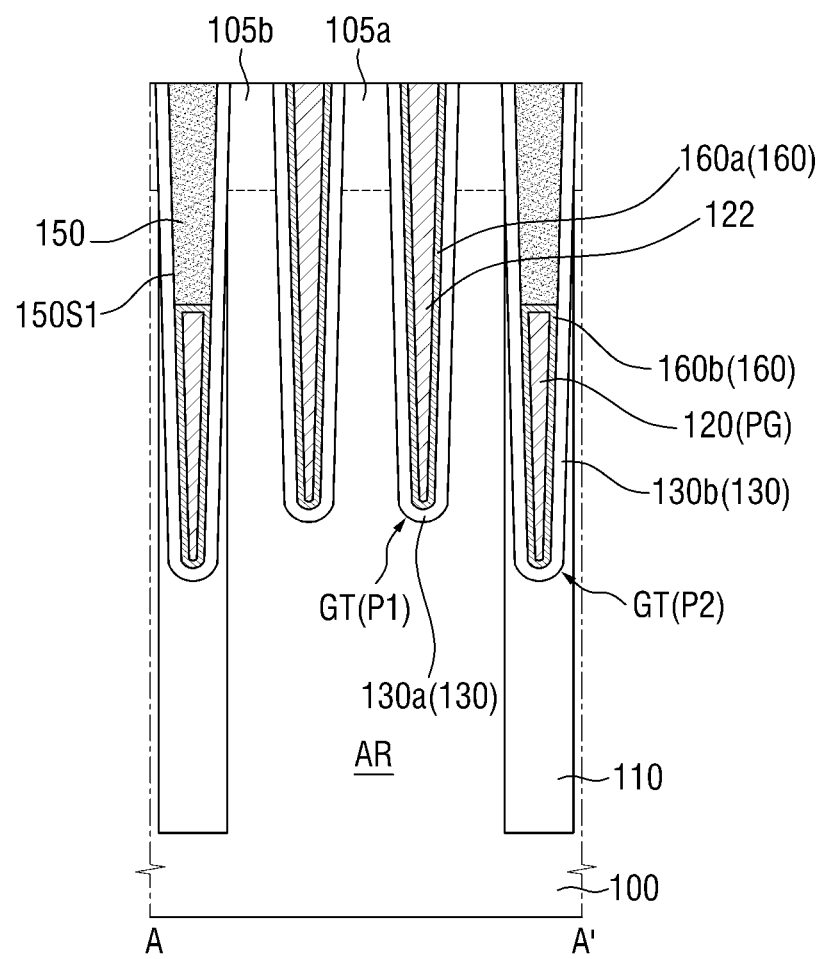

Referring to FIG. 23, a process of depositing a conductive layer on the resultant structure of FIG. 22 may be performed. For example, the filling conductive layer 122 may fill the inside of the first trench P1, and the pass gate electrode PG may fill the gap 400G for the pass gate electrode of the second trench P2.

In an implementation, the filling conductive layer 122 may include a metal, e.g., titanium (Ti), tantalum (Ta), tungsten (W), aluminum (Al), cobalt (Co), or a combination thereof.

Figure 24:
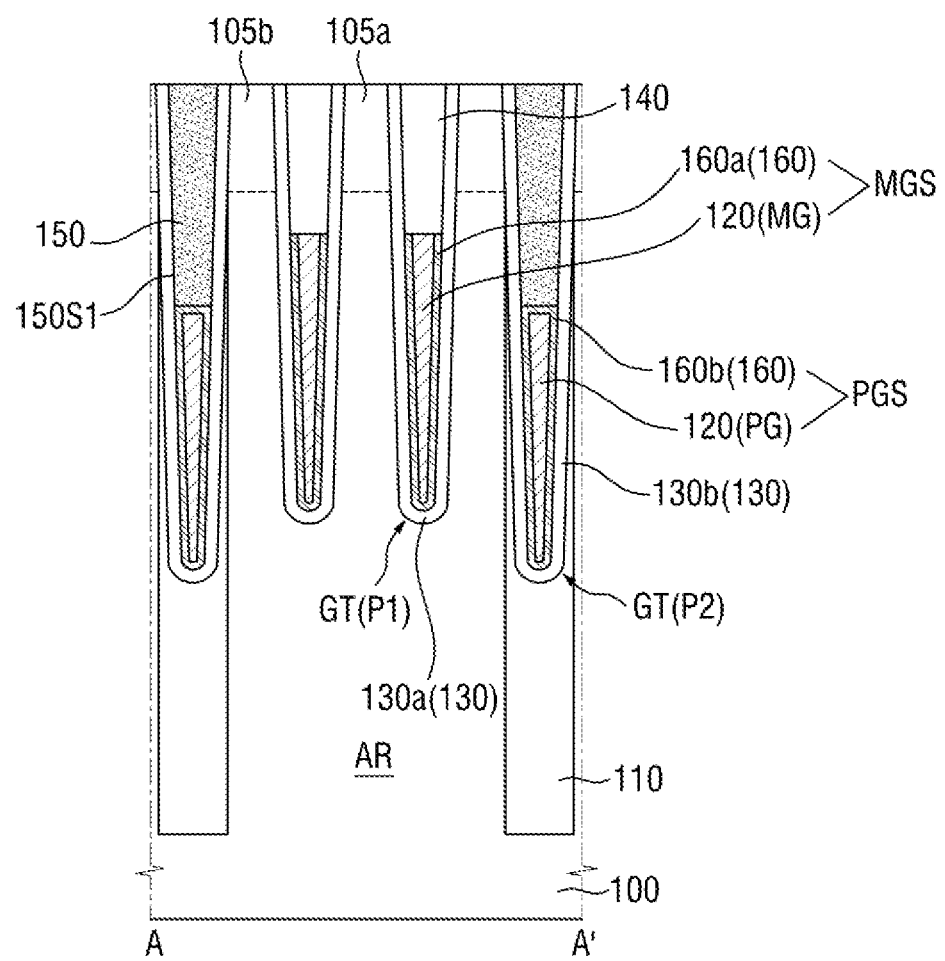

Referring to FIG. 24, after a process of planarizing the conductive layer is performed on the resultant structure of FIG. 23, a metal etch back process may be performed. The capping pattern 140 may be formed in the upper portion of the first trench P1 through the above-described series of processes.

FIGS. 25 to 33 illustrate stages in a method of manufacturing a semiconductor device according to some embodiments. Specifically, FIGS. 25 to 33 are cross-sectional views taken along line A-A' of FIG. 1. For simplicity of description, a repeated description overlapping with the description with reference to FIGS. 1, 6 and 7 may be briefly given or omitted.

Figure 25:
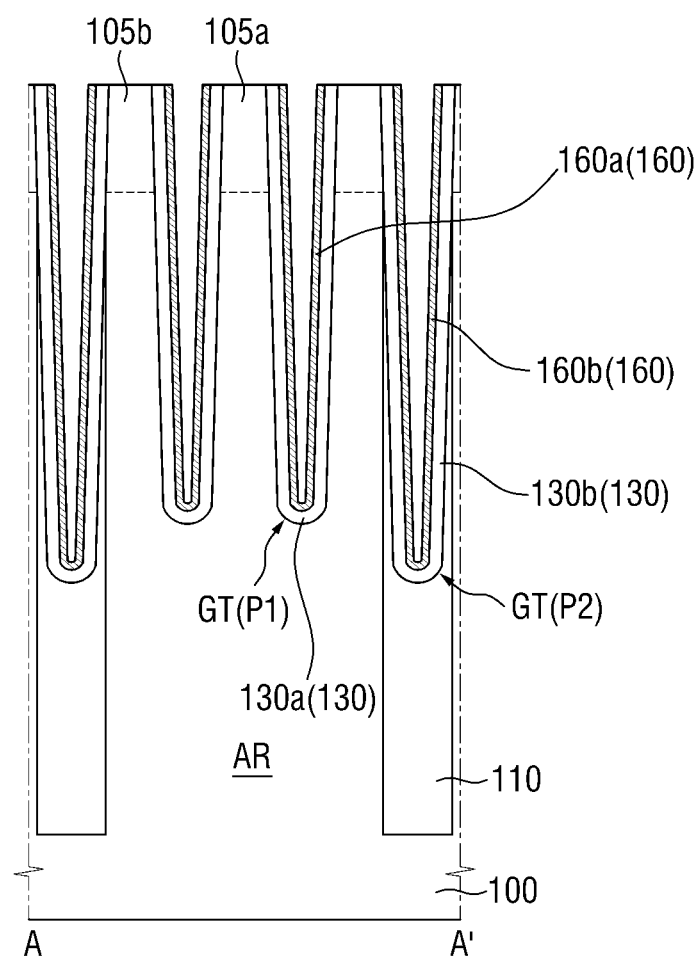
FIGS. 25 to 33 illustrate stages in a method of manufacturing a semiconductor device according to some embodiments.

Referring to FIG. 25, the first gate insulating layer 130a may be formed in the first trench P1, and the second gate insulating layer 130b may be formed in the second trench P2. Then, the barrier conductive layer 160 may be formed to cover the inner sidewall and the bottom surface of the gate insulating layer 130 formed in the gate trench GT.

For example, the first barrier conductive layer 160a may be formed to cover the bottom surface and the sidewall of the first gate insulating layer 130a. The second barrier conductive layer 160b may be formed to cover the bottom surface and sidewalls of the second gate insulating layer 130b.

Figure 26:
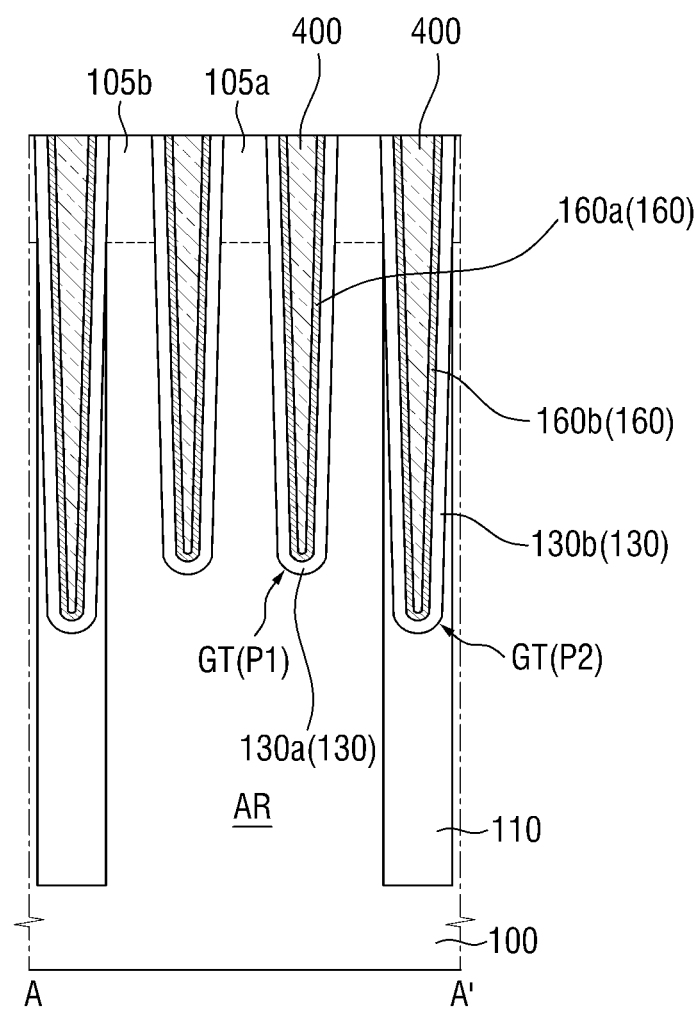

Referring to FIG. 26, the sacrificial layer 400 may fill the inside of the first trench P1 and the inside of the second trench P2.

The sacrificial layer 400 may be formed to cover the bottom surface and the sidewall of the first barrier conductive layer 160a in the first trench P1. In addition, the sacrificial layer 400 may be formed to cover the bottom surface and the sidewall of the second barrier conductive layer 160b in the second trench P2.

For example, the first barrier conductive layer 160a may be between the sacrificial layer 400 and the first gate insulating layer 130a. In addition, the second barrier conductive layer 160b may be between the sacrificial layer 400 and the second gate insulating layer 130b.

Figure 27:
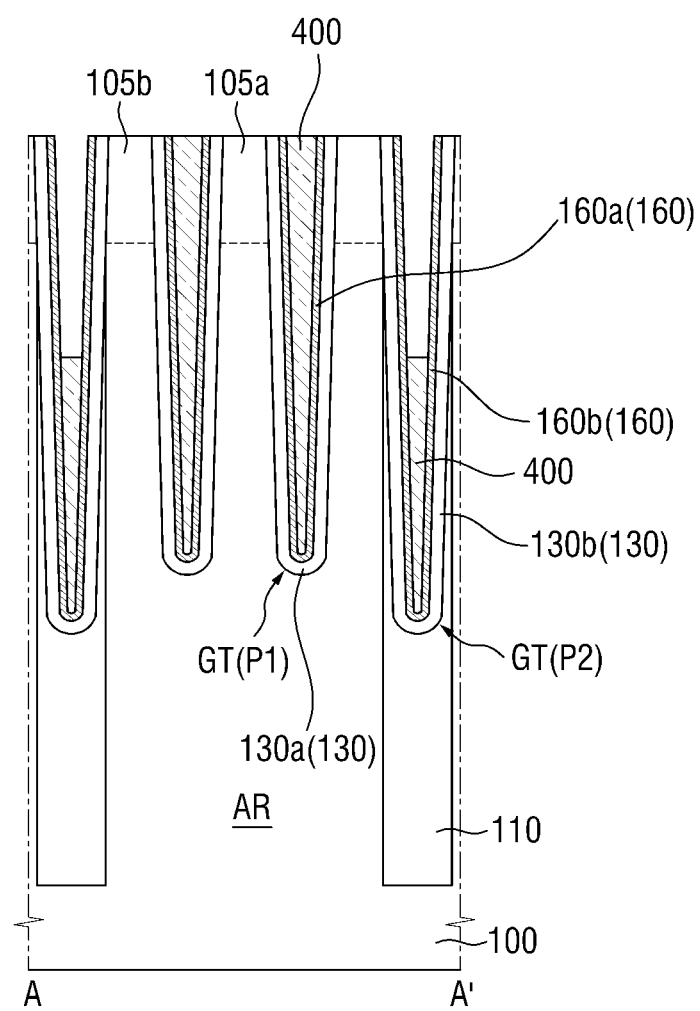
Figure 28:
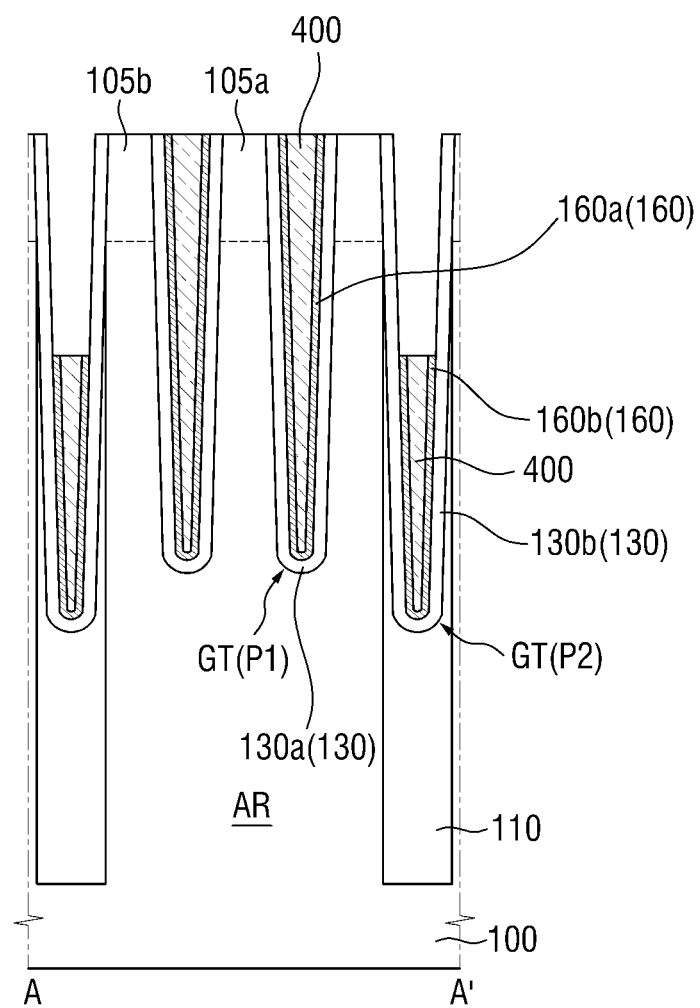

Referring to FIGS. 27 and 28, the sacrificial layer 400 in the upper portion of the second trench P2 may be selectively removed using a mask pattern. The sacrificial layer 400 in the lower portion of the second trench P2 may be exposed.

After the sacrificial layer 400 in the upper portion of the second trench P2 is removed, a cleaning process of removing a portion of the second barrier conductive layer 160b may be performed. For example, by removing the second barrier conductive layer 160b in (e.g., an upper portion of) the second trench P2, a portion of the second barrier conductive layer 160b in the lower portion of the second trench P2 may be exposed to the outside.

By removing the second barrier conductive layer 160b in the upper portion of the second trench P2, a portion of the second gate insulating layer 130b may be exposed to the outside. A portion of the second barrier conductive layer 160b and the sacrificial layer 400 in the lower portion of the second trench P2 may be exposed to the outside.

Figure 29:
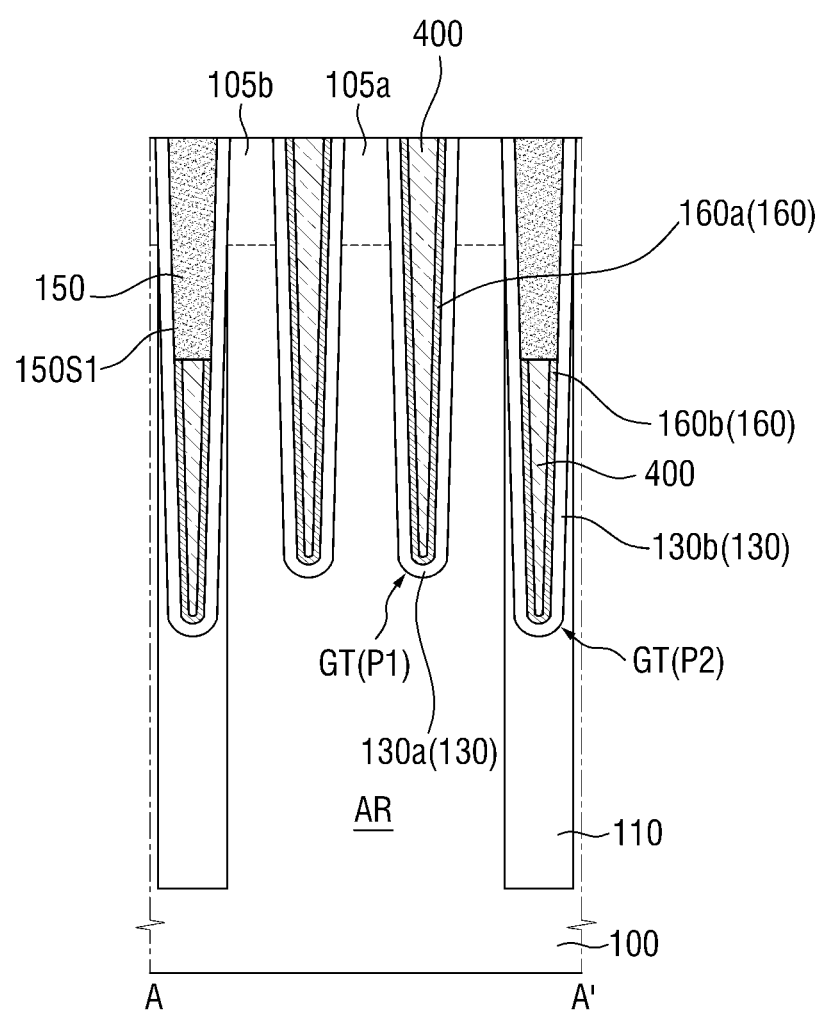

Referring to FIG. 29, the support structure 150 may be formed at a position where the sacrificial layer 400 and the second barrier conductive layer 160b have been removed. The support structure 150 may be formed in the upper portion of the second trench P2 to cover a portion of the inner wall of the second gate insulating layer 130b.

The bottom surface of the support structure 150 may be in contact (e.g., direct contact) with the top surface of the sacrificial layer 400 in the lower portion of the second trench P2, and may be in contact (e.g., direct contact) with the second barrier conductive layer 160b between the second gate insulating layer 130b and the sacrificial layer 400 in the lower portion of the second trench P2.

Figure 30:
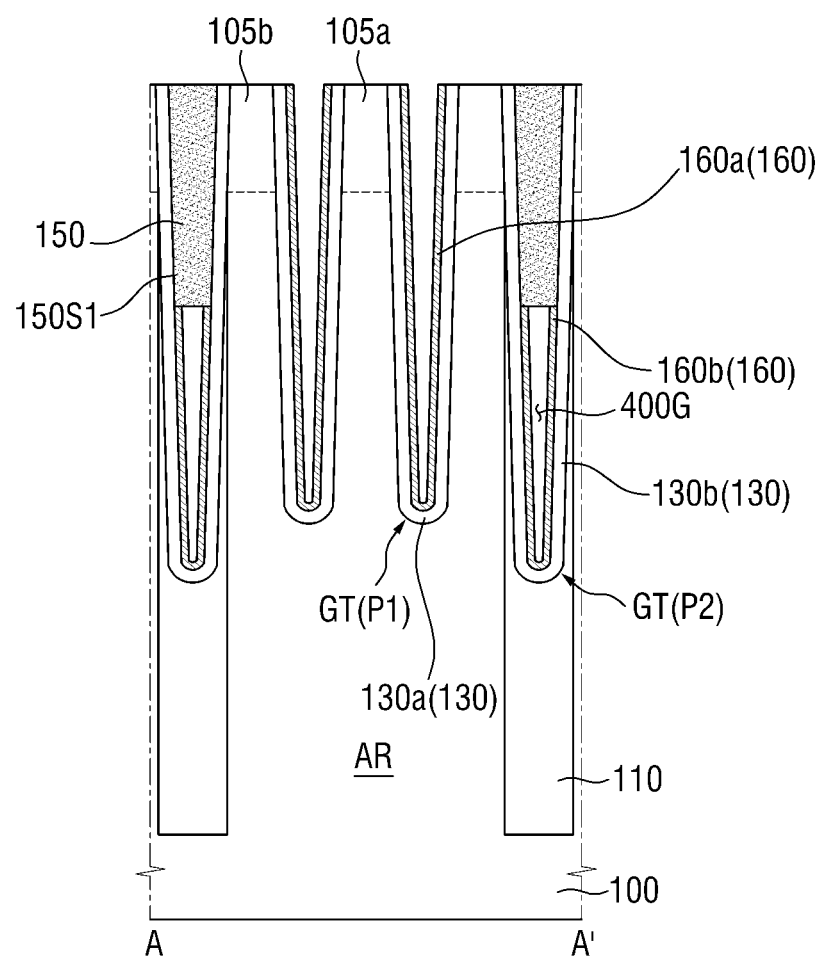

Referring to FIG. 30, the sacrificial layer 400 in the first trench P1 and the second trench P2 may be removed. By removing the sacrificial layer 400 in the second trench P2, the gap 400G for the pass gate electrode may be formed in the lower portion of the second trench P2.

By removing the sacrificial layer 400 in the first trench P1, the first barrier conductive layer 160a in the first trench P1 may be exposed to the outside.

As described above, the sacrificial layer 400 may have an etch selectivity with respect to the gate insulating layer 130 and the barrier conductive layer 160, and the gate insulating layer 130 and the barrier conductive layer 160 may not be removed while the sacrificial layer 400 is removed.

Figure 31:
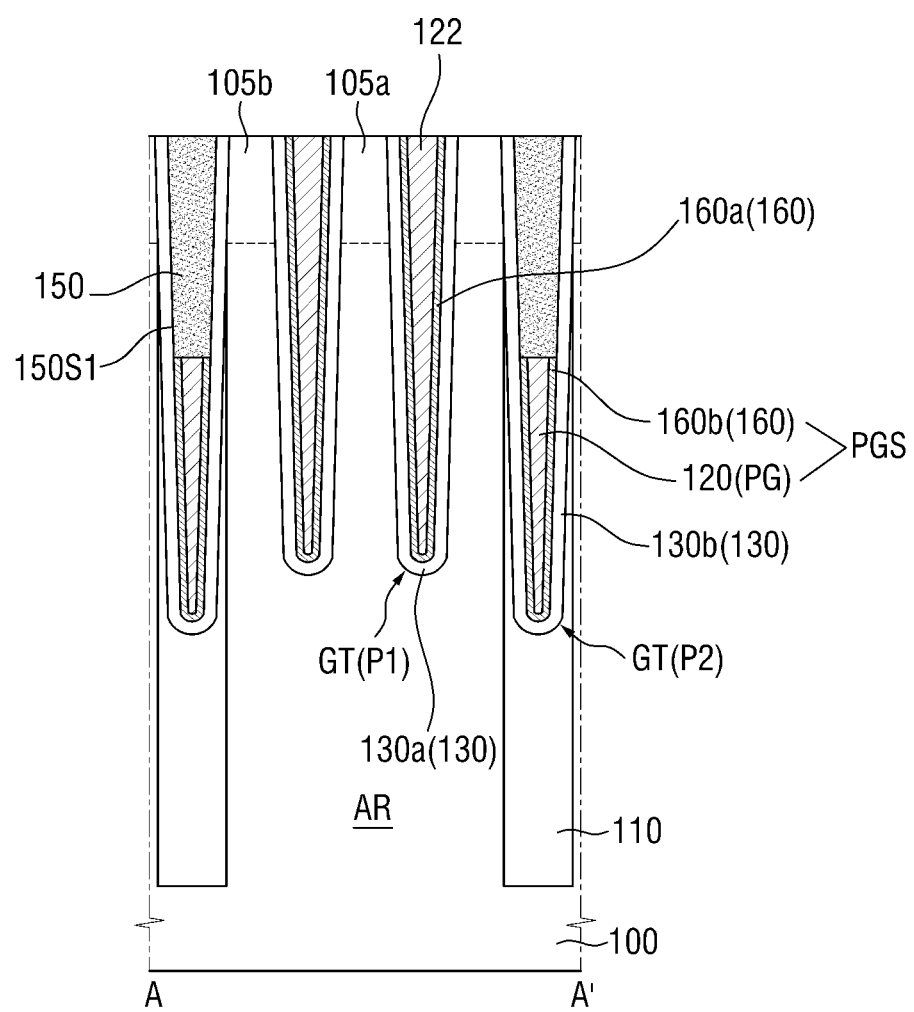

Referring to FIG. 31, the filling conductive layer 122 may be formed in the first trench P1. The filling conductive layer 122 may extend along the sidewall and the bottom surface of the first barrier conductive layer 160a to fill the inside of the first trench P1. The pass gate electrode PG may be formed in the gap 400G for the pass gate electrode in the lower portion of the second trench P2.

Thereafter, a planarization process may be performed on the filling conductive layer 122 until the top surface of the filling conductive layer 122 coincides with the top surface of the substrate 100.

The pass gate electrode PG may be in contact (e.g., direct contact) with the bottom surface and the sidewall of the second barrier conductive layer 160b. The second barrier conductive layer 160b may not extend between the bottom surface of the support structure 150 and the top surface of the pass gate electrode PG.

Figure 32:
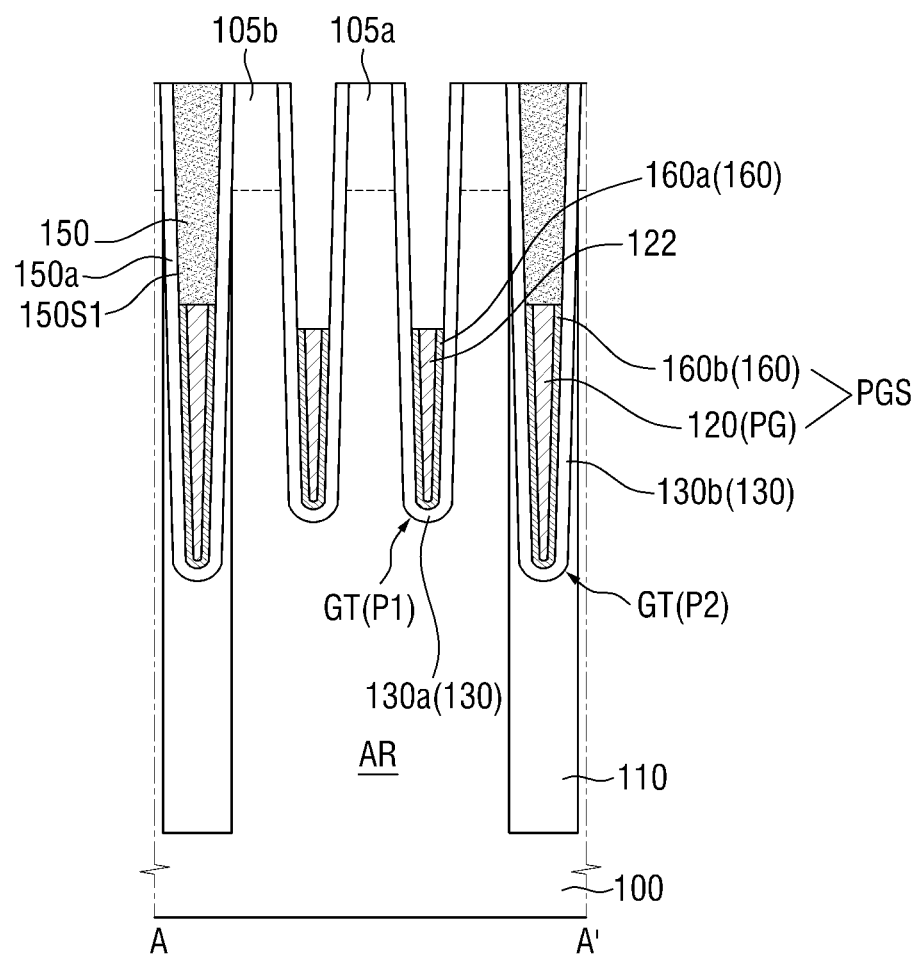

Referring to FIG. 32, a metal etch back process may be performed on the filling conductive layer 122. Accordingly, the first barrier conductive layer 160a and the filling conductive layer 122 in the upper portion of the first trench P1 may be removed through the metal etch back process, and only a portion of the first barrier conductive layer 160a and the filling conductive layer 122 in the lower portion of the first trench P1 may remain.

In an implementation, by the above-described metal etch back process, the top surface of the filling conductive layer 122 may be lower than the top surface of the pass gate electrode PG.

Figure 33:
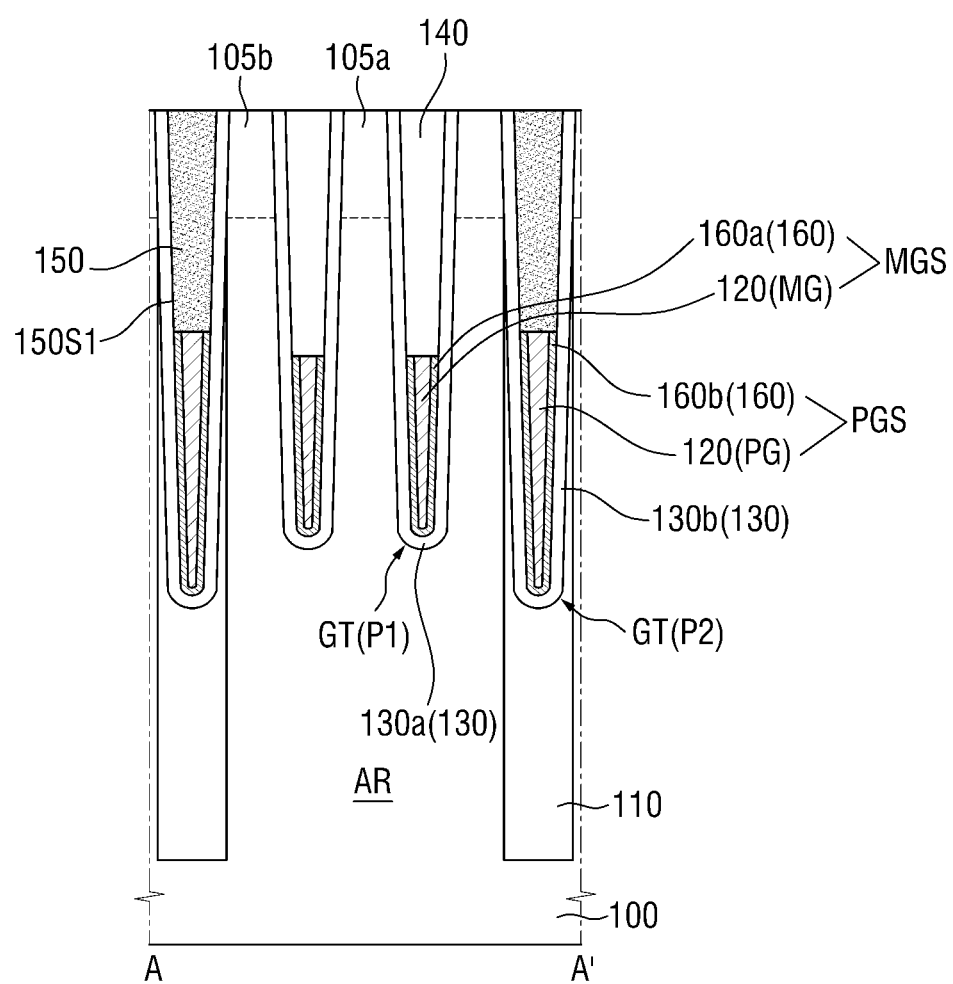

Referring to FIG. 33, the capping pattern 140 may be formed in the upper portion of the first trench P1 through a series of steps. The series of steps may include performing a deposition process of the first barrier conductive layer 160a, a LaO deposition process, and a deposition process of the filling conductive layer 122 on the resultant structure of FIG. 32, performing a planarization process, and then performing a metal etch back process again.

One or more embodiments may provide a semiconductor device including a buried channel array transistor.

One or more embodiments may provide a semiconductor device with improved product reliability and performance.

One or more embodiments may provide a method of manufacturing a semiconductor device with improved product reliability and performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A semiconductor device, comprising:
a device isolation layer defining an active region in a substrate;
a first trench in the active region;
a second trench in the device isolation layer;
a main gate electrode structure filling a lower portion of the first trench, the main gate electrode structure including a first barrier conductive layer and a main gate electrode;
a pass gate electrode structure filling a lower portion of the second trench, the pass gate electrode structure including a second barrier conductive layer and a pass gate electrode;
a support structure filling an upper portion of the second trench above the pass gate electrode;
a connection portion between the support structure and the pass gate electrode structure;
a first capping pattern filling an upper portion of the first trench above the main gate electrode; and
a second gate insulating layer extending along a bottom surface and a sidewall of the second trench,
wherein the second barrier conductive layer is between the second gate insulating layer and the pass gate electrode and extends along a bottom surface and a sidewall of the pass gate electrode, and
wherein the connection portion includes:
a support structure insulating layer extending along a bottom surface of the support structure and having a first thickness, and
a portion of the second gate insulating layer extending along a top surface of the pass gate electrode and having a second thickness different from the first thickness.

2. The semiconductor device as claimed in claim 1, wherein the second barrier conductive layer includes a portion extending along a top surface of the pass gate electrode.

3. The semiconductor device as claimed in claim 1, wherein the support structure insulating layer includes an oxide that is different from an oxide included in the second gate insulating layer.

4. The semiconductor device as claimed in claim 1, wherein a maximum width of the first capping pattern and a maximum width of the support structure are different from each other.

5. The semiconductor device as claimed in claim 1, further comprising a first gate insulating layer extending along a bottom surface and a sidewall of the first trench.

6. The semiconductor device as claimed in claim 5, wherein the first barrier conductive layer is between the first gate insulating layer and the main gate electrode and extends along a bottom surface and a sidewall of the main gate electrode.

7. The semiconductor device as claimed in claim 1, wherein, with respect to a top surface of the substrate, the first capping pattern has a first height, the support structure has a second height, and the first height is smaller than the second height.

8. The semiconductor device as claimed in claim 1, further comprising:
a first interlayer insulating layer on the substrate; and
a first contact structure passing through the first interlayer insulating layer in a thickness direction of the first interlayer insulating layer.

9. The semiconductor device as claimed in claim 1, wherein the first barrier conductive layer does not extend between a bottom surface of the first capping pattern and a top surface of the main gate electrode.

10. A semiconductor device, comprising:
an active region extending in a first direction in a substrate;
a device isolation layer defining the active region in the substrate;
a second gate trench in the device isolation layer, the second gate trench extending in a second direction forming a first acute angle with respect to the first direction;
a pass gate electrode filling a lower portion of the second gate trench in the device isolation layer;
a support structure filling an upper portion of the second gate trench above the pass gate electrode; and
a second barrier conductive layer extending along a surface between a top surface of the pass gate electrode and a bottom surface of the support structure.

11. The semiconductor device as claimed in claim 10, wherein the second barrier conductive layer further extends along a sidewall and a bottom surface of the pass gate electrode.

12. The semiconductor device as claimed in claim 10, further comprising:
a first gate trench extending in the second direction forming a first acute angle with respect to the first direction in the active region;
a main gate electrode filling a lower portion of the first gate trench in the active region; and
a first capping pattern filling an upper portion of the first gate trench above the main gate electrode.

13. The semiconductor device as claimed in claim 12, wherein a height of the first capping pattern is smaller than a height of the support structure, with respect to a top surface of the substrate.

14. The semiconductor device as claimed in claim 10, further comprising:
a second gate insulating layer extending along a bottom surface and a sidewall of the second gate trench; and
a connection portion between the support structure and the pass gate electrode,
wherein the connection portion includes:
a support structure insulating layer extending along a bottom surface of the support structure and having a first thickness, and
a portion of the second gate insulating layer extending along a top surface of the pass gate electrode and having a second thickness different from the first thickness.

15. A semiconductor device, comprising:
a device isolation layer defining an active region in a substrate;
a first trench in the active region;
a second trench in the device isolation layer;
a main gate electrode structure filling a lower portion of the first trench, the main gate electrode structure including a first barrier conductive layer and a first filling conductive layer;
a pass gate electrode structure filling a lower portion of the second trench, the pass gate electrode structure including a second barrier conductive layer and a second filling conductive layer;

a support structure filling an upper portion of the second trench above the pass gate electrode structure; and a first capping pattern filling an upper portion of the first trench above the main gate electrode structure, wherein:

the second barrier conductive layer extends along a surface between a bottom surface of the support structure and a top surface of the second filling conductive layer, a height of the support structure is greater than a height of the first capping pattern, with respect to a top surface of the substrate, and a maximum width of the first capping pattern and a maximum width of the support structure are different from each other.

16. The semiconductor device as claimed in claim 15, wherein:

the second barrier conductive layer extends along a bottom surface and a sidewall of the second filling conductive layer, the semiconductor device further includes a second gate insulating layer extending along a bottom surface, a sidewall, and a top surface of the second barrier conductive layer.

17. The semiconductor device as claimed in claim 15, further comprising a first gate insulating layer extending along a bottom surface and a sidewall of the first trench.

18. The semiconductor device as claimed in claim 15, further comprising:

a support structure insulating layer extending along a bottom surface and a sidewall of the support structure;

a second gate insulating layer extending along a bottom surface and a sidewall of the second trench; and a connection portion between the support structure and the pass gate electrode structure, wherein the connection portion includes:

a portion of the support structure insulating layer extending along the bottom surface of the support structure and having a first thickness, and a portion of the second gate insulating layer extending along a top surface of the pass gate electrode and having a second thickness different from the first thickness.

19. The semiconductor device as claimed in claim 15, wherein the first barrier conductive layer extends along a bottom surface and a sidewall of the first filling conductive layer.

* * * * *